US009065424B2

(12) United States Patent
Nakanishi et al.

(10) Patent No.: US 9,065,424 B2
(45) Date of Patent: Jun. 23, 2015

(54) ACOUSTIC WAVE DEVICE WITH REDUCED HIGHER ORDER TRANSVERSE MODES

(75) Inventors: Hidekazu Nakanishi, Osaka (JP); Hiroyuki Nakamura, Osaka (JP); Tetsuya Tsurunari, Osaka (JP); Joji Fujiwara, Osaka (JP)

(73) Assignee: SKYWORKS PANASONIC FILTER SOLUTIONS JAPAN CO., LTD, Osaka (JP)

( * ) Notice: Subject to any disclaimer, the term of this patent is extended or adjusted under 35 U.S.C. 154(b) by 105 days.

(21) Appl. No.: 13/992,624

(22) PCT Filed: Mar. 5, 2012

(86) PCT No.: PCT/JP2012/001495
§ 371 (c)(1),
(2), (4) Date: Jun. 7, 2013

(87) PCT Pub. No.: WO2012/132238
PCT Pub. Date: Oct. 4, 2012

(65) Prior Publication Data
US 2013/0249647 A1   Sep. 26, 2013

(30) Foreign Application Priority Data

Mar. 25, 2011   (JP) .................................. 2011-068857

(51) Int. Cl.
*H03H 9/00* (2006.01)
*H03H 9/54* (2006.01)
*H03H 9/02* (2006.01)

(52) U.S. Cl.
CPC ............. *H03H 9/54* (2013.01); *H03H 9/02559* (2013.01); *H03H 9/02834* (2013.01); *H03H 9/02858* (2013.01); *H03H 9/02881* (2013.01); *H03H 9/02984* (2013.01); *H03H 9/02992* (2013.01)

(58) Field of Classification Search
None
See application file for complete search history.

(56) References Cited

U.S. PATENT DOCUMENTS 5,789,845 A * 8/1998 Wadaka et al. ............... 310/334
7,453,334 B1 * 11/2008 Abbott et al. ................. 333/195
(Continued)

FOREIGN PATENT DOCUMENTS

EP   1962424 A1   8/2008
EP   2023485 A1   2/2009
(Continued)

OTHER PUBLICATIONS

International Search Report issued in International Patent Application No. PCT/JP2012/001495 mailed on Jul. 19, 2012.
(Continued)

*Primary Examiner* — Long Nguyen
(74) *Attorney, Agent, or Firm* — Lando & Anastasi, LLP

(57) ABSTRACT

In an acoustic wave device, a high-order transverse mode wave which is an unnecessary wave is suppressed. The acoustic wave device includes: a piezoelectric substrate; at least one pair of IDT electrodes formed on the piezoelectric substrate; and a dielectric film which covers at least a part of the piezoelectric substrate and the IDT electrodes, and the IDT electrodes each has a plurality of electrode fingers. The dielectric film covers at least an area in which the electrode fingers are arranged interleaved with each other. An acoustic velocity of an acoustic wave in an intersection area, within the region, which is a portion from ends of the electrode fingers to a predetermined length or more inward from the ends, is greater than an acoustic velocity of an acoustic wave in an edge area including end portions of the electrode fingers.

20 Claims, 23 Drawing Sheets

(56) References Cited

U.S. PATENT DOCUMENTS

| | | |
|---|---|---|
| 7,576,471 B1 | 8/2009 | Solal |
| 2007/0096592 A1 | 5/2007 | Kadota et al. |
| 2007/0176711 A1 | 8/2007 | Kando |
| 2009/0267707 A1 | 10/2009 | Miura et al. |
| 2010/0060101 A1 | 3/2010 | Iwasaki et al. |
| 2011/0068655 A1* | 3/2011 | Solal et al. ................ 310/313 B |
| 2011/0199169 A1* | 8/2011 | Kadota ......................... 333/195 |

FOREIGN PATENT DOCUMENTS

| | | |
|---|---|---|
| EP | 2066026 A1 | 6/2009 |
| JP | 07-058582 A | 3/1995 |
| JP | 08-097671 A | 4/1996 |
| JP | 2006-217517 A | 8/2006 |
| JP | 2007-110342 A | 4/2007 |
| WO | WO-2005/034347 A1 | 4/2005 |
| WO | 2006-123585 A1 | 11/2006 |
| WO | 2008-146449 A1 | 12/2008 |
| WO | WO-2010/137279 A1 | 12/2010 |
| WO | WO-2011/088904 A1 | 7/2011 |
| WO | WO-2011/105316 A1 | 9/2011 |
| WO | WO-2012/076517 A1 | 6/2012 |

OTHER PUBLICATIONS

Solal M. et al. "Transverse modes suppression and loss reduction for buried electrodes SAW devices" Ultrasonics Symposium (IUS), 2010 IEEE International Ultrasonics Symposium Proceedings, pp. 624-628. Oct. 11, 2010.

* cited by examiner

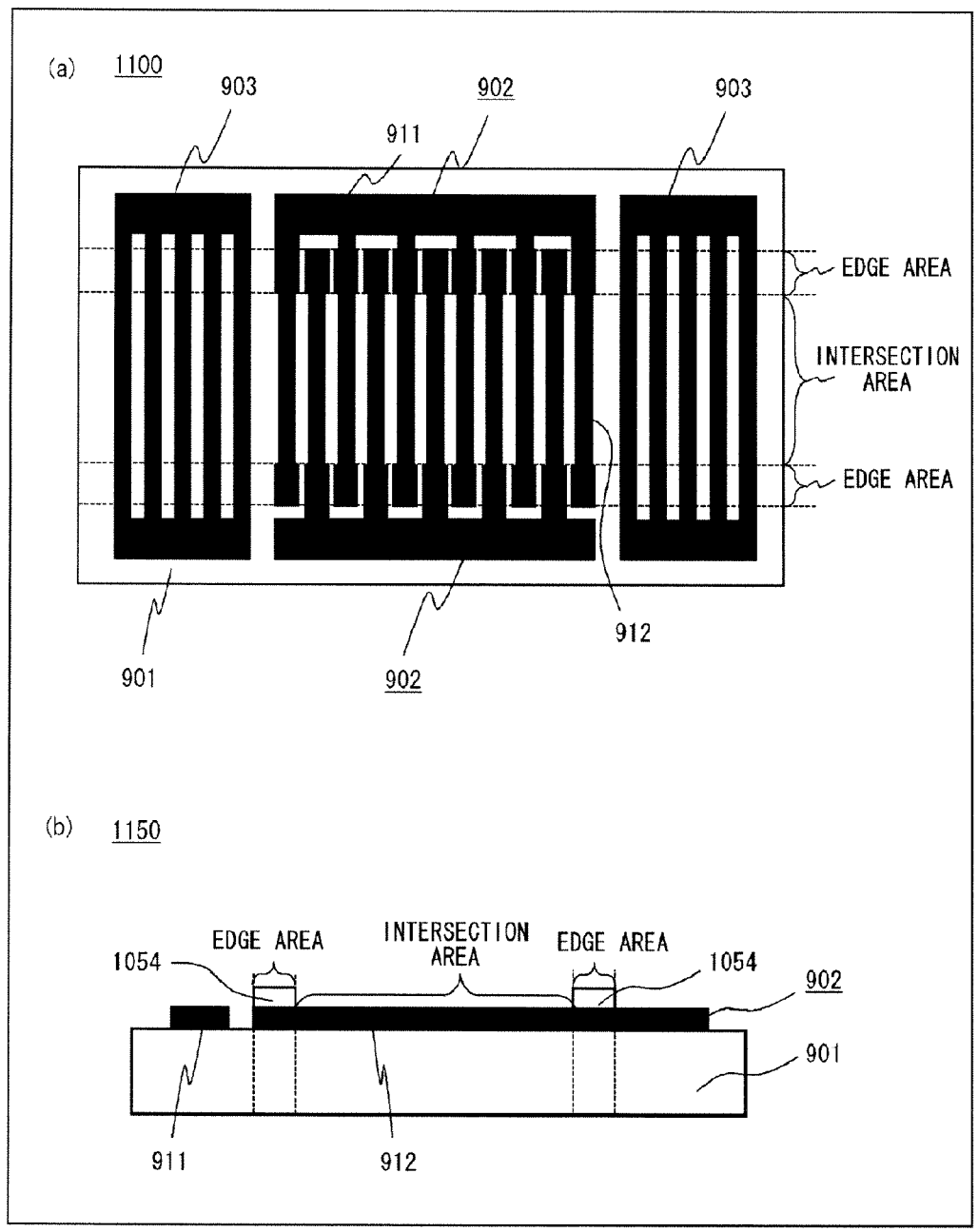

Fig. 29                    PRIOR ART
1200
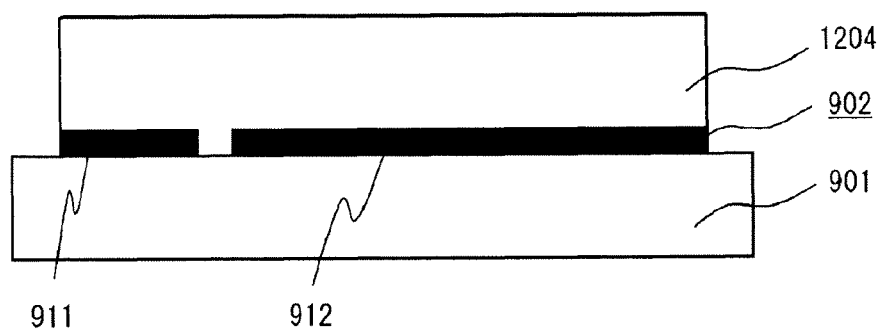

ACOUSTIC WAVE DEVICE WITH REDUCED HIGHER ORDER TRANSVERSE MODES

RELATED APPLICATIONS

This application is the U.S. National Phase under 35 U.S.C. §371 of International Application No. PCT/JP2012/001495, filed on Mar. 5, 2012, which in turn claims the benefit of Japanese Application No. 2011-068857, filed on Mar. 25, 2011, the disclosures of which Applications are incorporated by reference herein.

TECHNICAL FIELD

The present invention relates to acoustic wave devices used for bandpass filters and the like.

BACKGROUND ART

In recent years, in the field of information communication devices such as mobile phones, acoustic wave devices having a comb-shaped IDT electrode formed on a surface of a piezoelectric substrate are used as circuit elements such as resonators, filters, and the like. FIG. 26 shows examples of such acoustic wave devices. In (a) of FIG. 26, a top view of an acoustic wave device 900 is shown. The acoustic wave device 900 is formed by arranging two IDT electrodes 902 and two reflectors 903 on a piezoelectric substrate 901. The IDT electrodes 902 each have a bus bar 911 and a plurality of electrode fingers 912 that extends from the bus bar 911. The respective electrode fingers 912 of each of the IDT electrodes 902 are arranged such that the electrode fingers 912 thereof are arranged interleaved with the respective electrode fingers 912 of the other IDT electrode 902. The reflectors 903 are arranged so as to interpose the IDT electrodes 902 therebetween. In (b) of FIG. 26, a top view of another acoustic wave device 950 is shown. The acoustic wave device 950 is different from the acoustic wave device 900 in that dummy electrode fingers 913 that extend, from the bus bar 911, alternately with the electrode fingers 912 are further provided, and in that the electrode fingers 912 are arranged so as to face the dummy electrode fingers 913 of the other IDT electrode 902. In each of the acoustic wave devices 900 and 950, a strip-shaped intersection area within the region in which the electrode fingers 912 are arranged interleaved with each other, excluding end portions of the respective electrode fingers 912, is used as a main propagation path of an acoustic wave.

Patent Literature 1 discloses an acoustic wave device 1000 which is different from the acoustic wave device 900 in that a waveguide is formed by providing a coating film 1004 that serves as a piezoelectric body or an insulator in the intersection area. FIG. 27 is a sectional view of the acoustic wave device 1000 aligned along a single electrode finger 912. In the acoustic wave device 1000, propagation of an acoustic wave is concentrated to the coating film 1004, thereby suppressing a high-order transverse mode wave which is an unnecessary wave.

Patent Literature 2 discloses: an acoustic wave device 1100 which is different from the acoustic wave device 900 in that, in each of two strip-shaped edge areas adjacent to the intersection area, including end portions of the respective electrode fingers 912, the electrode fingers 912 of the IDT electrode each have an increased width and an increased film thickness; and an acoustic wave device 1150 which is different from the acoustic wave device 900 in that a dielectric film 1154 is provided on the IDT electrode only in the edge areas. In (a) of FIG. 28, a top view of the acoustic wave device 1100 is shown. In (b) of FIG. 28, a sectional view of the acoustic wave device 1150 aligned along a single electrode finger 912 is shown. It is generally known that, in an acoustic wave device, acoustic velocities in edge areas and bar areas are decreased so as to be less than an acoustic velocity in an intersection area. Accordingly, in the intersection area that serves as a main propagation path, a fundamental transverse mode wave can be confined and a high-order transverse mode wave which is an unnecessary wave can be suppressed. However, in Patent Literature 2, acoustic velocities in the edge areas are controlled by increasing end portions of the electrode fingers of the IDT electrode in size and mass.

Patent Literature 3 discloses an acoustic wave device 1200 which is different from the acoustic wave device 900 in that a dielectric film 1204 covers the piezoelectric substrate 901, the IDT electrodes 902, and the reflectors 903 such that the surface thereof is flattened. FIG. 29 is a sectional view of the acoustic wave device 1200 aligned along a single electrode finger 912. In the acoustic wave device 1200, the dielectric film 1204 covers the piezoelectric substrate 901, thereby reducing frequency characteristic change of the acoustic wave device 1200 depending on temperature.

CITATION LIST

Patent Literature

PTL 1: Japanese Patent No. 3201088
PTL 2: U.S. Pat. No. 7,576,471
PTL 3: PCT International Publication No. WO 2005/034347 (Japanese Application No. 2005-509259)

SUMMARY OF INVENTION

Technical Problem

Conventionally, in an acoustic wave device, frequency characteristic change depending on temperature may be stabilized by covering at least an intersection area and edge areas with a dielectric film; however, no consideration has been given to suppressing a high-order transverse mode wave. Consequently, even in an acoustic wave device which is covered by a dielectric film for stabilizing the frequency characteristic change depending on temperature, in order to control a high-order transverse mode, shapes of end portions and the like of electrode fingers of an IDT electrode need to be specially designed.

Therefore, an object of the present invention is, in an acoustic wave device in which a dielectric film covers at least an intersection area and edge areas, to suppress high-order transverse mode wave which is an unnecessary wave.

Solution to Problem

An acoustic wave device of the present invention includes: a piezoelectric substrate; at least a pair of IDT electrodes formed on the piezoelectric substrate; and a dielectric film which covers at least a part of the piezoelectric substrate and the IDT electrodes, and the pair of IDT electrodes each include a bus bar and a plurality of electrode fingers which extend from the bus bar, and the respective electrode fingers of one of the IDT electrodes are arranged interleaved with the respective electrode fingers of the other IDT electrode. The dielectric film covers at least a region in which the electrode fingers are arranged interleaved with each other. An acoustic velocity of an acoustic wave in an intersection area, within the region, which is a portion from ends of the electrode fingers to a predetermined length or more inward from the ends, is greater than an acoustic velocity of an acoustic wave in an edge area which is a portion adjacent to the intersection area, including end portions of the electrode fingers.

Further, each of the pair of IDT electrodes may be connected to the bus bar and include a plurality of dummy electrode fingers which are not arranged interleaved with the electrode fingers of the other IDT electrode.

Either an area, adjacent to the edge area, from the ends of the electrode fingers to the bus bar of the other IDT electrode, or an area, adjacent to the edge area, from the ends of the electrode fingers to ends of the dummy electrode fingers which face the electrode fingers, is a gap area, the acoustic velocity in each of the gap areas is greater than the acoustic velocity in each of the edge areas.

A material of the piezoelectric substrate is lithium niobate, a material of the dielectric film is silicon dioxide, and a film thickness of the dielectric film in the intersection area is thinner than a film thickness of the dielectric film in the edge area.

Furthermore, the dielectric film may preferably have a lamination structure including two kinds of silicon dioxide films or a lamination structure including a silicon dioxide film and a dielectric film that further covers the silicon dioxide film.

Alternatively, it is preferable that a first dielectric film which covers at least the area in which the electrode fingers are arranged interleaved with each other and a second dielectric film which is formed on the first dielectric film and further covers the intersection area are included as the dielectric film, and an acoustic velocity of the second dielectric film is greater than an acoustic velocity of the first dielectric film.

In this case, it is preferable that a material of the first dielectric film is silicon dioxide, and a material of the second dielectric film is any of silicon nitride, silicon oxynitride, and aluminium nitride.

Alternatively, it is preferable that a first dielectric film which covers at least the area in which the electrode fingers are arranged interleaved with each other; and a third dielectric film which is formed on the first dielectric film and further covers the edge areas are included as the dielectric film, and an acoustic velocity of the third dielectric film is less than an acoustic velocity of the first dielectric film.

In this case, it is preferable that a material of the first dielectric film is silicon dioxide and a material of the third dielectric film is tantalum(V) oxide.

Further, it is preferable that the intersection area of the dielectric film is covered with a passivation film having a moisture resistance higher than a moisture resistance of the dielectric film.

It is preferable that a region including the intersection area of the dielectric film is covered with a passivation film having a moisture resistance higher than a moisture resistance of the dielectric film, and a film thickness of the passivation film in the intersection area is thicker than a film thickness in the region other than the intersection area.

It should be noted that it is preferable that at least a part of an electrode film thickness of the bus bar is thicker than an electrode film thickness of the electrode fingers.

Alternatively, the dielectric film may cover the dummy electrode fingers or the area in which the bus bar is arranged with a film thickness thinner than a film thickness with which the dielectric film covers the intersection area.

Further, it is preferable that the piezoelectric substrate has a cut angle and a propagation angle of, when they are represented by the Euler angle (phi,theta,psi) of right-handed orthogonal coordinates, theta being equal to or greater than 36 degrees but equal to or less than 41 degrees.

Further, it is preferable that the IDT electrode has a lamination structure including a first metal layer mainly composed any of platinum, tungsten, and molybdenum and a second metal layer laminated on the first metal layer having a higher conductivity than the first metal layer.

Further, the acoustic wave device may further includes two reflectors formed on the piezoelectric substrate, and a plurality of pairs of the IDT electrodes may be formed between the two reflectors, and the two reflectors and the plurality of pairs of the IDT electrodes may be arranged along a propagating direction of a main acoustic wave, thereby constituting a longitudinally coupled filter.

Further, it is preferable that a tapered portion forms a portion of each of ends of the intersection area and/or the edge areas of the dielectric film where a film thickness of the dielectric film changes, in a manner such that the film thickness of the dielectric film continuously changes at the tapered portion.

Advantageous Effects of Invention

According to the present invention, in an acoustic wave device in which a dielectric film covers at least an intersection area and edge areas, it is possible to suppress a high-order transverse mode wave which is an unnecessary wave.

BRIEF DESCRIPTION OF DRAWINGS

FIG. 28 is a top view of a conventional acoustic wave device.

FIG. 29 is a sectional view of a conventional acoustic wave device.

DESCRIPTION OF EMBODIMENTS

First Embodiment

Figure 1:
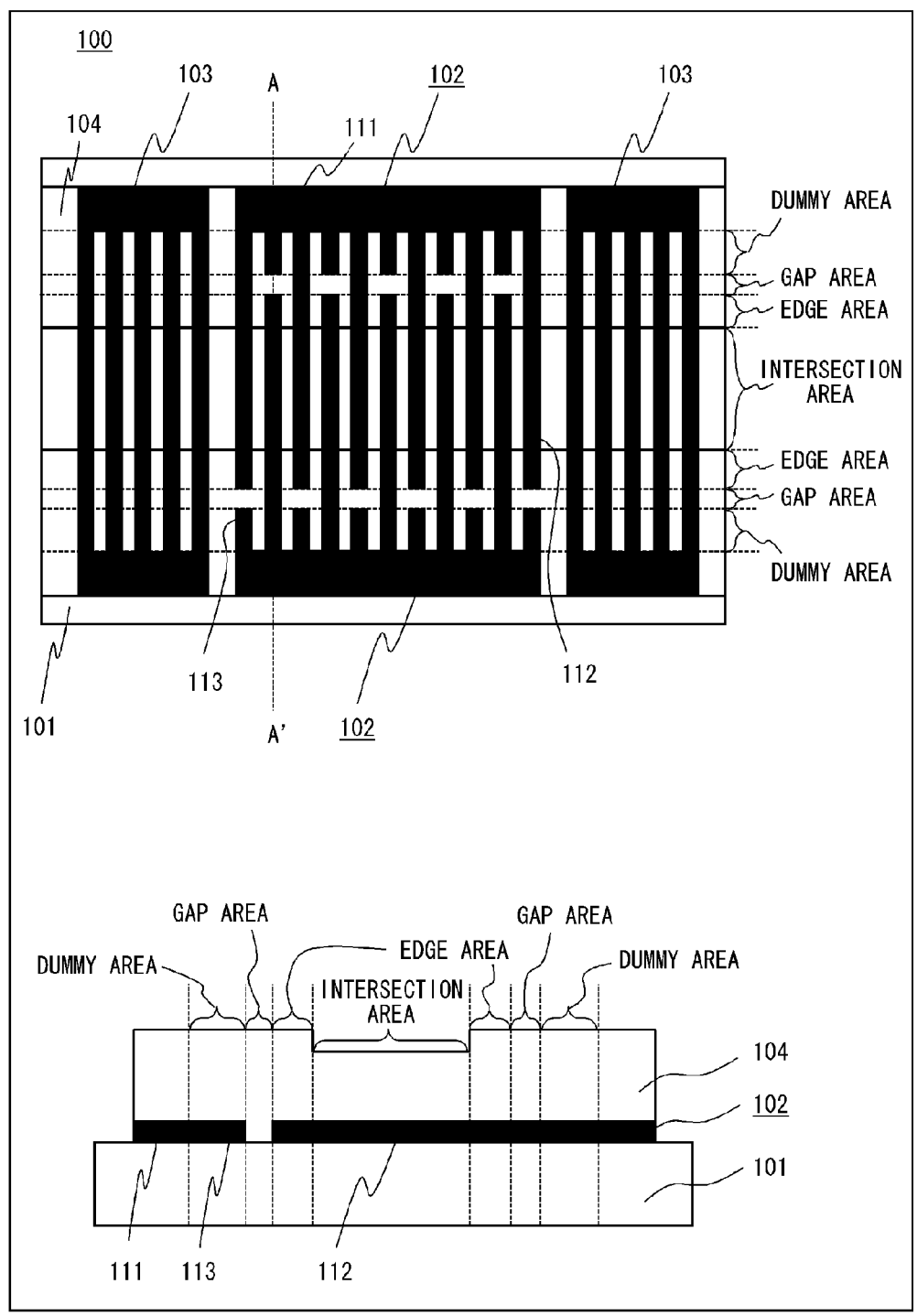
FIG. 1 is a top view and a sectional view of an acoustic wave device according to a first embodiment of the present invention.

Hereinafter, a first embodiment of the present invention will be described. FIG. 1 is a see-through top view of an acoustic wave device 100 according to the present embodiment and a sectional view of the same taken along a line A-A'. The acoustic wave device 100 includes a piezoelectric substrate 101, and two IDT electrodes 102 and two reflectors 103 arranged on the piezoelectric substrate 101. These are covered by a dielectric film 104. The IDT electrodes 102 each have a bus bar 111, and a plurality of electrode fingers 112 and a plurality of dummy electrode fingers 113, which alternately extend from the bus bar 111. The respective electrode fingers 112 from one side of the IDT electrodes 102 are arranged interleaved with the respective electrode fingers 112 from the other side of the IDT electrode 102, in a manner such that ends of the electrode fingers 112 face the ends of the dummy electrode fingers 113 from the other side of the IDT electrode 102. The reflectors 103 are arranged so as to interpose the IDT electrode therebetween. It is preferred if the piezoelectric substrate is lithium niobate which has a cut angle and a propagation angle of, when they are represented by the Euler angle (phi,theta,psi) of right-handed orthogonal coordinates, theta being equal to or greater than 36 degrees but equal to or less than 41 degrees. It should be noted that phi and psi are each an arbitrary value between equal to or greater than −10 degrees but equal to or less than 10 degrees. It is further preferred if the IDT electrodes 102 and the reflectors 103 each have a configuration including a lamination structure including a first metal layer mainly composed any of platinum, tungsten, and molybdenum and a second metal layer laminated on the first metal layer having a higher conductivity than the first metal layer. With this, it is possible to reduce characteristics loss and control electrode resistance of the acoustic wave device 100. Further, an example of material for the dielectric film is silicon dioxide ($SiO_2$).

In the acoustic wave device 100, a strip-shaped area within a region in which the respective electrode fingers 112 are arranged interleaved with each other, excluding an area from the ends of the respective electrode fingers to a predetermined length is referred to as intersection area. Further, in the region in which the respective electrode fingers 112 are arranged interleaved with each other, two strip-shaped areas each adjacent to the intersection area, including an area from the ends of the respective electrode fingers 112 to the predetermined length, are referred to as edge areas. Still further, two strip-shaped areas adjacent to the respective edge areas, each including an area between the ends of the respective electrode fingers 112 and the ends of the respective dummy electrode fingers 113 that face the corresponding electrode fingers 112, are called gap areas. Yet further, two strip-shaped areas adjacent to the respective gap areas, each including an area between the ends of the respective dummy electrode fingers 113 and the edges of the bus bar 111 on the side from which the electrode fingers extend, are referred to as dummy areas. The acoustic wave device 100 uses a Rayleigh wave as a main acoustic wave and, the intersection area among the areas described above is used as a main propagation path.

In the acoustic wave device 100, a dielectric film is formed such that a film thickness thereof in the intersection area is thinner than a film thickness thereof in the edge areas. With this configuration, in the acoustic wave device 100, (acoustic velocity in the intersection area)>(acoustic velocity in the edge areas) is established. Further, in the acoustic wave device 100, (acoustic velocity in the gap areas)>(acoustic velocity in the edge areas) is established. Consequently, a fundamental transverse mode wave can be confined in the intersection area and a high-order transverse mode wave which is spurious can be suppressed.

Further, in the acoustic wave device 100, by covering a part of the bus bar areas with a dielectric film, a passivation effect on the bus bar areas can be obtained. At this time, the relationship among the acoustic velocities is represented by (acoustic velocity in the intersection area)>(acoustic velocity in the bus bar areas), and (acoustic velocity in the edge areas)>(acoustic velocity in the bus bar areas).

Figure 2:
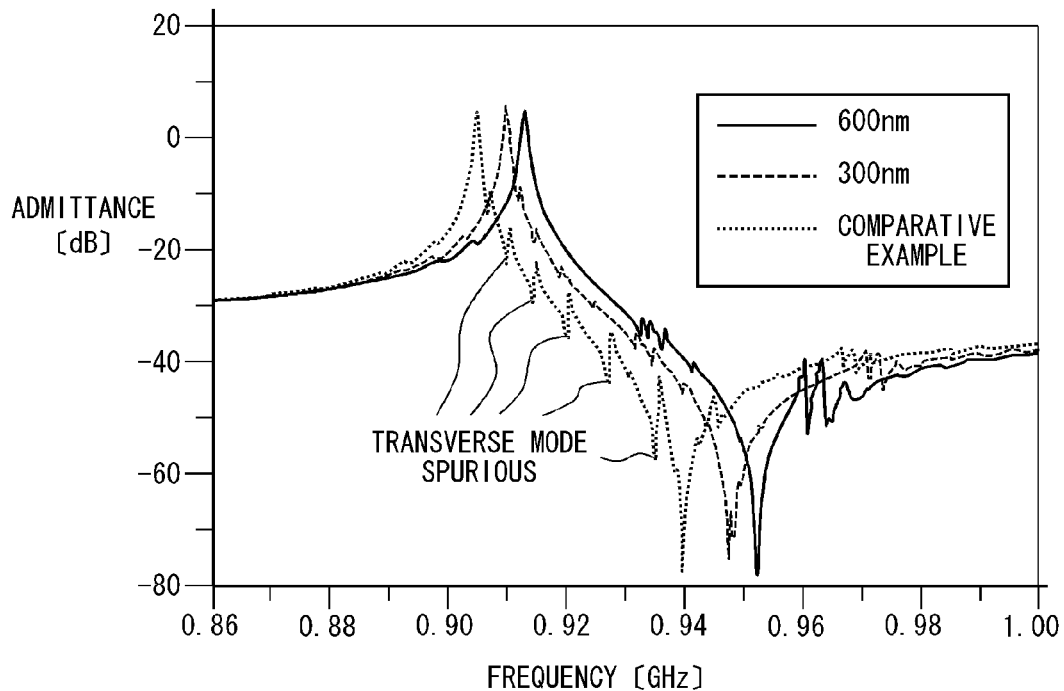
FIG. 2 shows characteristics of the acoustic wave device according to the first embodiment of the present invention.

FIG. 2 is a graph showing frequency characteristics of the admittance in the acoustic wave device 100, in cases where: the film thickness of the dielectric film is 1300 nanometers on the IDT electrode; the film thickness of the dielectric film is thinner in the intersection area than in the edge areas by 300 nanometers; and the film thickness of the dielectric film is thinner in the intersection area than in the edge area by 600 nanometers. Here, the pitch of the IDT electrodes in the acoustic wave device 100 is 2 micrometers and a half of a wave length lambda of the main acoustic wave. Further, in the acoustic wave device 100, when the film thickness of the dielectric is normalized by the wave length lambda of the main acoustic wave, the film thickness the dielectric film of 1300 nanometers described above is 0.325 lambda, the film thickness of the dielectric film when it is thinner by 300 nanometers described above is 0.25 lambda, and the film thickness of the dielectric film when it is thinner by 600 nanometers described above is 17.5%. As a comparative example, FIG. 2 also shows a frequency characteristic when, in the acoustic wave device 100, the film thickness of the dielectric film in the intersection area is not thinner as in the conventional acoustic wave device. As shown in FIG. 2, it is appreciated that the acoustic wave device 100 of the present embodiment suppresses a transverse mode spurious when compared to the comparative example. It should be noted that, in the above description, the wave length lambda of the main acoustic wave is 4 micrometers; however, when another wave length is wave length lambda of the main acoustic wave, the film thickness of the dielectric film may be a film thickness normalized by the wave length lambda as described above.

Figure 3:
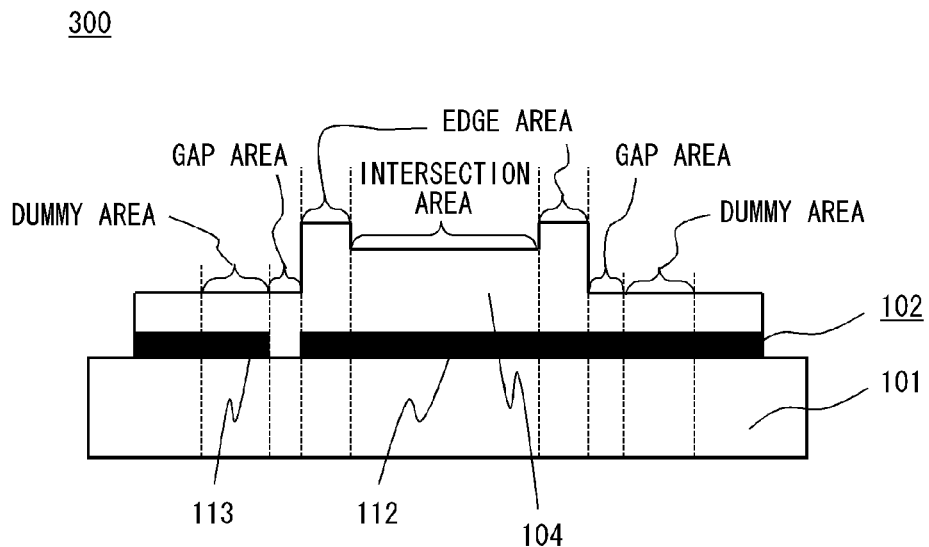
FIG. 3 shows a modification of the acoustic wave device according to the first embodiment of the present invention.

Further, FIG. 3 shows a modification of the present embodiment. FIG. 3 is a sectional view showing a section of an acoustic wave device 300 according to the present embodiment in the same manner as the acoustic wave device 100 shown in FIG. 1. The acoustic wave device 300 is different from the acoustic wave device 100 in that the film thickness of the dielectric film 104 in the gap area, or in and outside the dummy area thinner than the film thickness of the dielectric film 104 in the edge area. Accordingly, an acoustic wave can be suppressed from leaking from the intersection area which is a main propagation path, thereby further enhancing confinement of the acoustic wave in the intersection area.

Figure 4:
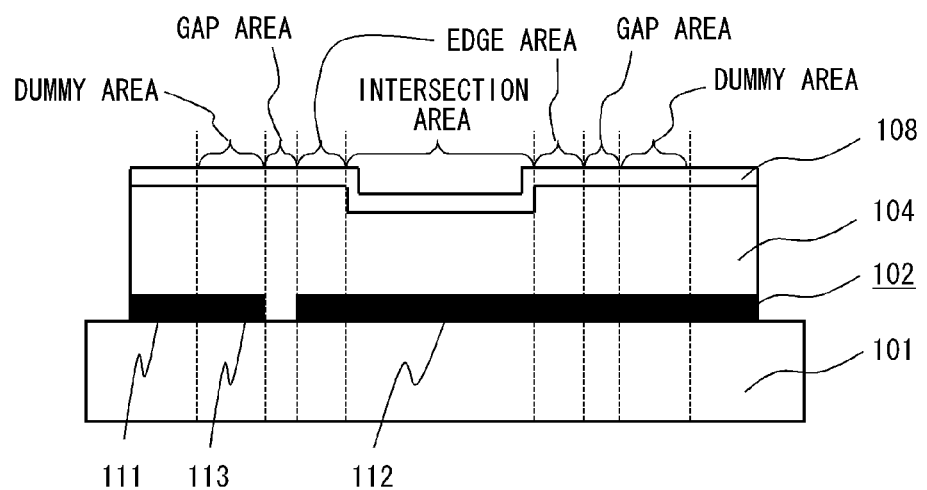
FIG. 4 shows another modification of the acoustic wave device according to the first embodiment of the present invention.

Further, as shown in FIG. 4, by covering the dielectric film 104 by a passivation film 108 having a higher moisture resistance than the dielectric film 104, moisture resistance of the acoustic wave device 100 can be improved. Examples of this passivation film are silicon nitride (SiN), silicon oxynitride (SiON), and aluminium nitride (AlN).

Figure 5:
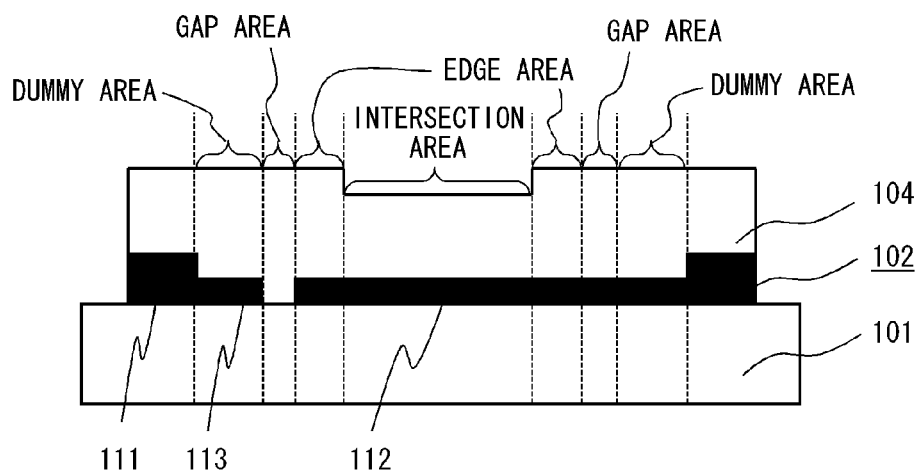
FIG. 5 shows another modification of the acoustic wave device according to the first embodiment of the present invention.

Still further, as shown in FIG. 5, at least a part of the electrode film thickness of the bus bar 111 is made thicker than the electrode film thickness of the electrode fingers 112, thereby suppressing electrode resistance of the IDT electrodes 102 and improving characteristics of the acoustic wave device 100. It should be noted that, instead of the bus bar 111, the film thickness of a wiring electrode (not shown) connected to a bus bar may be made thicker than the electrode fingers 112 of the IDT electrodes 102. In this case, wiring resistance of the acoustic wave device 100 can be suppressed and insertion loss of the acoustic wave device 100 can be reduced.

Figure 6:
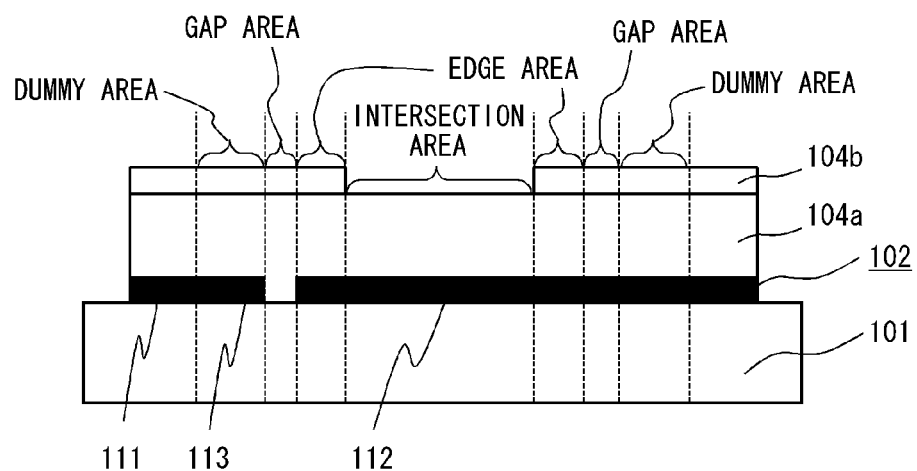
FIG. 6 shows another modification of the acoustic wave device according to the first embodiment of the present invention.

As shown in FIG. 6, the dielectric film 104 may have a lamination structure including silicon dioxide films 104a, 104b1. In this case, the silicon dioxide film 104a is laminated on the entirety of a top face of the IDT electrodes 102, and a silicon dioxide film 104b is laminated on an area excluding the intersection area on the top face of the IDT electrodes 102, the area including the edge areas, the gap areas, and the dummy areas. Accordingly, yield in the manufacturing process of the acoustic wave device 100 will be increased. It should be noted that the silicon dioxide film 104b may be a dielectric film made of another material having a greater acoustic velocity than a silicon dioxide film.

Figure 7:
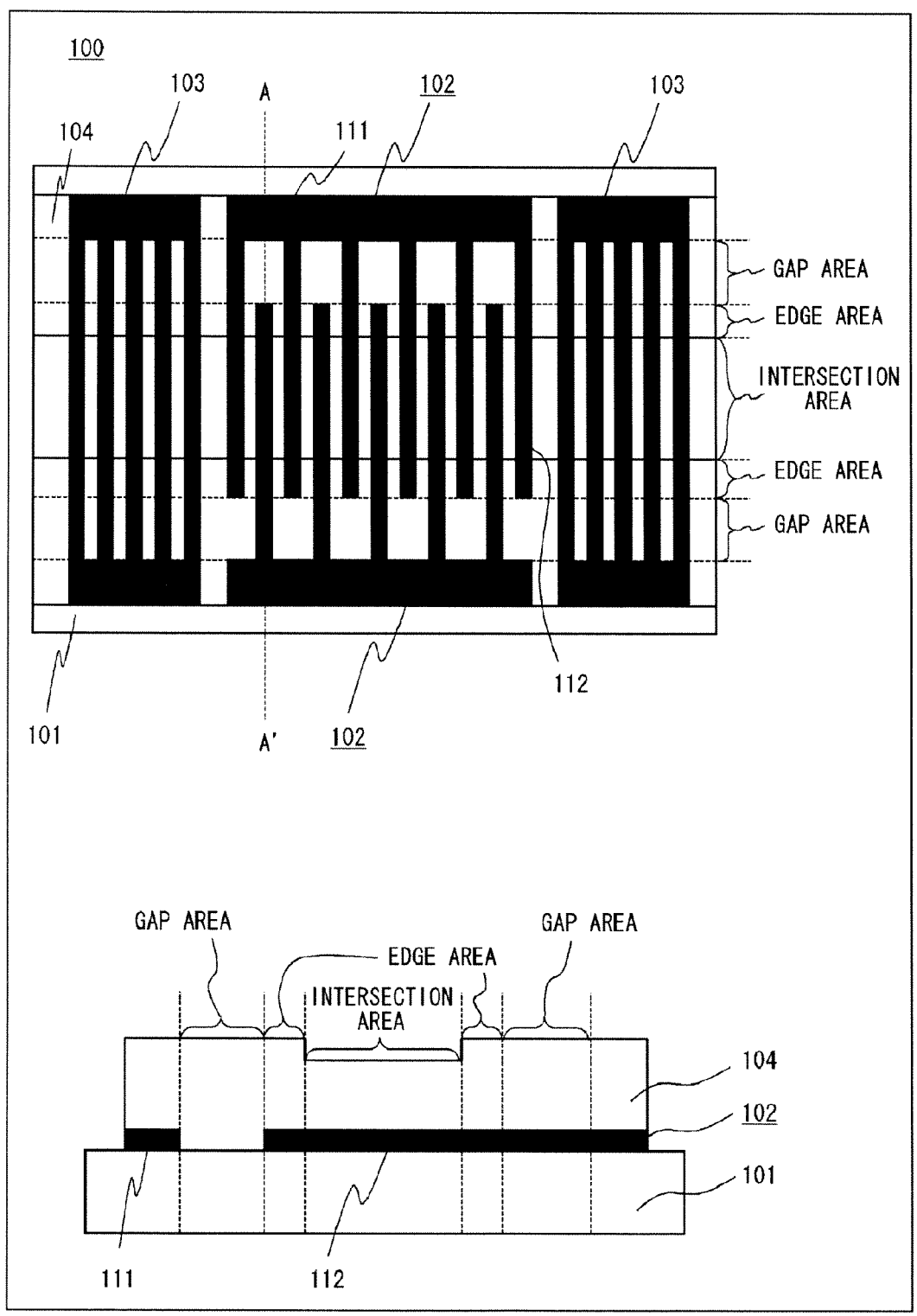
FIG. 7 shows another modification of the acoustic wave device according to the first embodiment of the present invention.

The acoustic wave device 100 in which the IDT electrodes 102 includes the dummy electrode fingers 113 has been described above; however, as shown in FIG. 7, the IDT electrodes 102 may not include the dummy electrode fingers 113. In this case, the IDT electrodes 102 have no dummy area and each gap area is an area between the ends of the respective electrode fingers 112 and the bus bar of the other IDT electrode. In this case also, in the acoustic wave device 100, (acoustic velocity in the intersection area)>(acoustic velocity in the edge areas), and (acoustic velocity in the gap areas)> (acoustic velocity in the edge areas) are established. Consequently, a fundamental transverse mode wave can be confined in the intersection area and a high-order transverse mode wave which is spurious can be suppressed.

Second Embodiment

Figure 8:
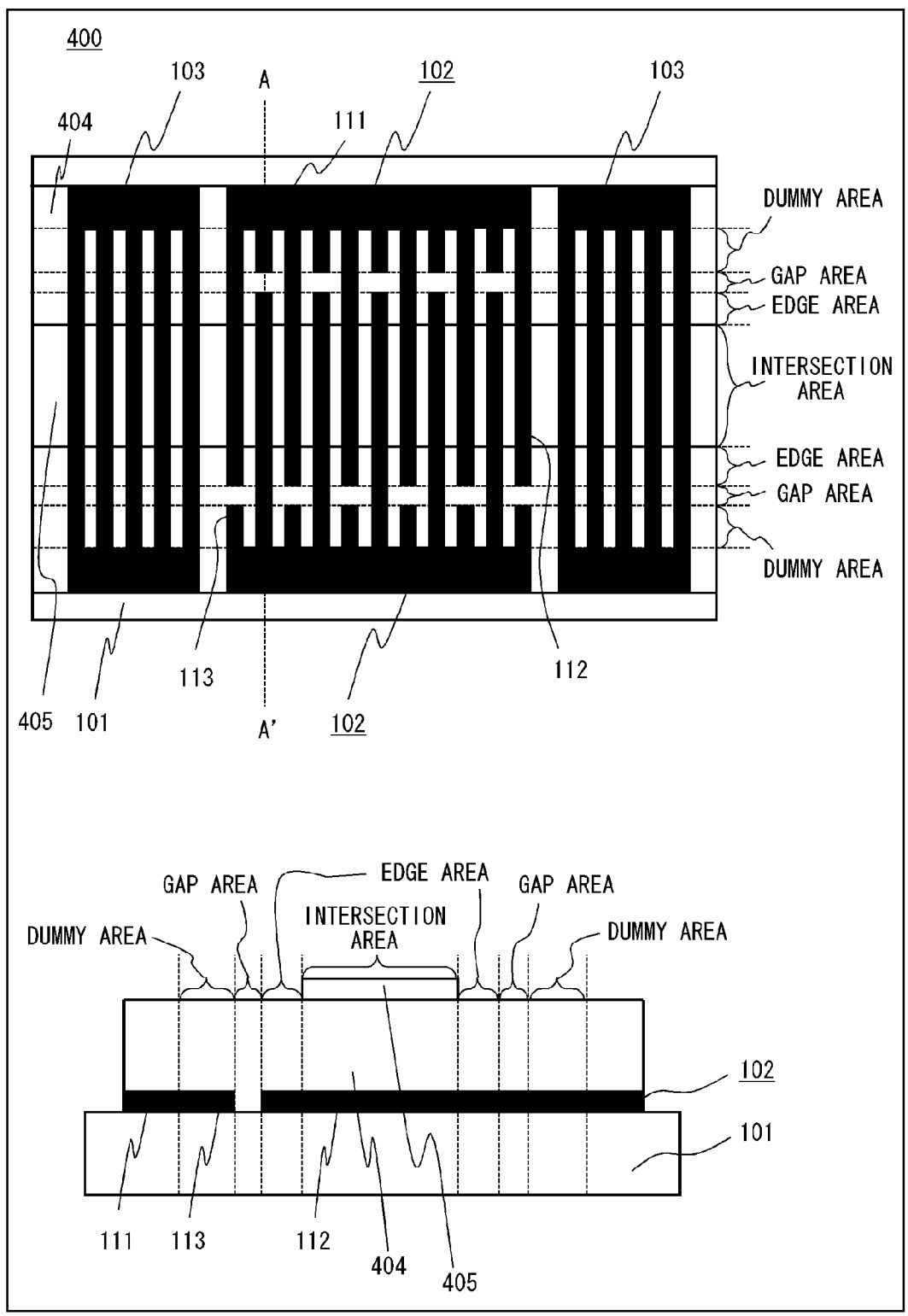
FIG. 8 is a top view and a sectional view of an acoustic wave device according to a second embodiment of the present invention.

Hereinafter, a second embodiment of the present invention will be described. FIG. 8 is a see-through top view of an acoustic wave device 400 according to the present embodiment and a sectional view of the same taken along a line A-A'. The acoustic wave device 400 includes, as in the same manner as the acoustic wave device 100 of the first embodiment, the piezoelectric substrate 101 and two IDT electrodes 102 and two reflectors 103 arranged on the piezoelectric substrate 101. However, the acoustic wave device 400 is different from the acoustic wave device 100 in that these components are covered with a first dielectric film 404 and further covered with a second dielectric film 405.

In the acoustic wave device 400, the first dielectric film 404 covers the piezoelectric substrate 101, the IDT electrodes 102, and the reflectors 103 so as to form a flat surface. Further, the second dielectric film 405 covers the intersection area on the first dielectric film 404 with a constant film thickness. An example of material of the first dielectric film 404 is silicon dioxide ($SiO_2$). Examples of material of the second dielectric film 405 are silicon nitride (SiN), silicon oxynitride (SiON), aluminium oxide ($Al_2O_3$), aluminium nitride (AlN), and the like. These materials are selected so that the second dielectric film 405 has an acoustic velocity greater than an acoustic velocity of the first dielectric film 404.

In the acoustic wave device 400, (acoustic velocity in the intersection area)>(acoustic velocity in the edge areas) is established due to an influence of the second dielectric film 405 that covers the intersection area. Further, in the acoustic wave device 400, (acoustic velocity in the gap areas)>(acoustic velocity in the edge areas) is established. Consequently, a fundamental transverse mode wave can be confined in the intersection area and a high-order transverse mode wave which is spurious can be suppressed.

Still further, in the acoustic wave device 400, by covering a part of the bus bar area with the dielectric film, a passivation effect on the bus bar area can be obtained. At this time, the relationship among the acoustic velocities is represented by (acoustic velocity in the intersection area)>(acoustic velocity in the bus bar area), and (acoustic velocity in the edge areas) >(acoustic velocity in the bus bar area).

Figure 9:
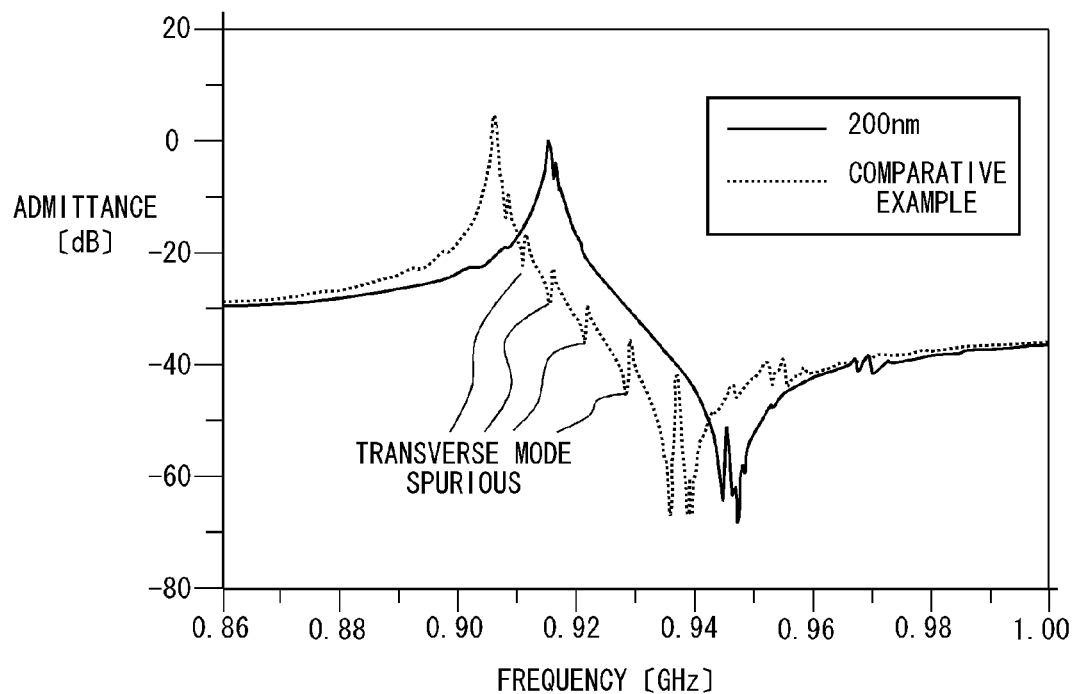
FIG. 9 shows characteristics of the acoustic wave device according to the second embodiment of the present invention.

FIG. 9 is a graph showing a frequency characteristic of the admittance, when, in the acoustic wave device 400, the second dielectric film 405 has a film thickness of 30 nanometers. Here, the pitch of the IDT electrodes 102 in the acoustic wave device 400 is 2 micrometers, and the film thickness of the dielectric film is 0.015 lambda when normalized by the wave length lambda of the main acoustic wave. As a comparative example, FIG. 9 also shows a frequency characteristic when, in the acoustic wave device 400, the second dielectric film 405 is not included. As shown in FIG. 9, it is appreciated that the acoustic wave device 400 of the present embodiment controls a transverse mode spurious when compared to the comparative example. It should be noted that, in the above description, the wave length lambda of the main acoustic wave is 4 micrometers; however, when another wave length is wave length lambda of the main acoustic wave, the film thickness of the dielectric film may be a film thickness normalized by the wave length lambda as described above.

Figure 10:
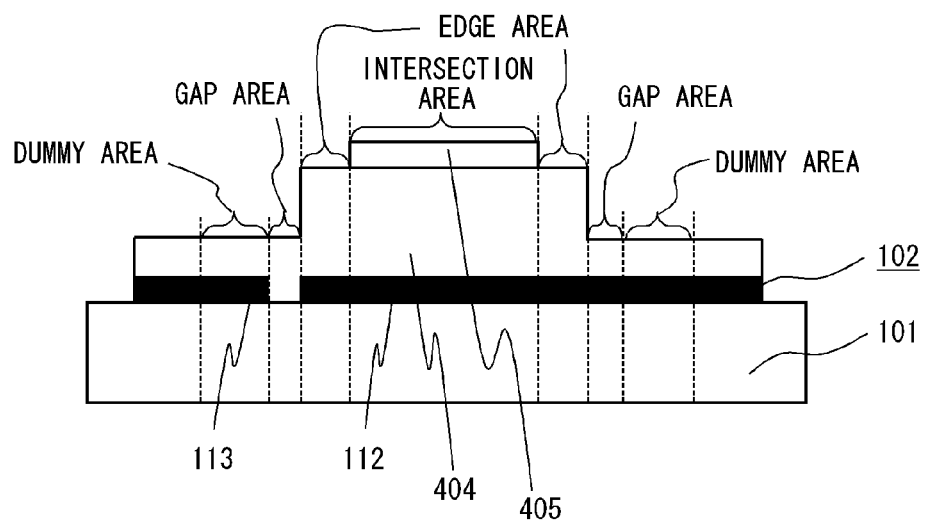
FIG. 10 shows a modification of the acoustic wave device according to the second embodiment of the present invention.

FIG. 10 shows a modification of the present embodiment. FIG. 10 shows a section of an acoustic wave device 600 according to the present embodiment, in the same manner as the sectional view of the acoustic wave device 100 shown in FIG. 1. The acoustic wave device 600 is different from the acoustic wave device 400 in that the film thickness of the first dielectric film 404 in the gap area, or in and outside the dummy area is thinner than the film thickness of the first dielectric film 404 in the edge area. Accordingly, an acoustic wave can be suppressed from leaking from the intersection area which is a main propagation path, thereby further enhancing confinement of the acoustic wave in the intersection area.

It should be noted that the second dielectric film 405 is preferably provided on the first dielectric film 404 in the gap area or the dummy area, in addition to the intersection area. With this, an acoustic wave can be further suppressed from leaking from the intersection area which is the main propagation path, thereby further enhancing the confinement of the acoustic wave in the intersection area.

Figure 11:
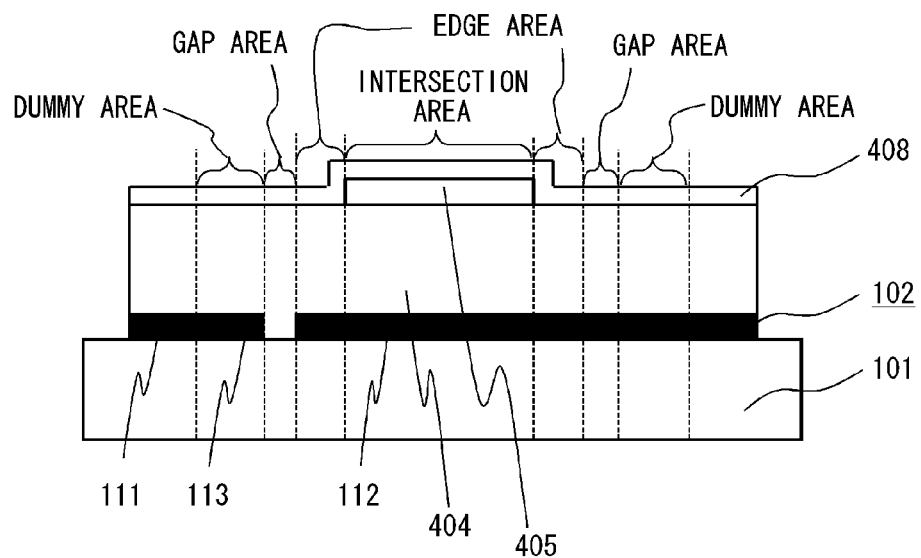
FIG. 11 shows another modification of the acoustic wave device according to the second embodiment of the present invention.

Further, as shown in FIG. 11, by covering the first dielectric film 404 by a passivation film 408 having a higher moisture resistance than the first dielectric film 404, moisture resistance of the acoustic wave device 400 can be improved. Examples of this passivation film are silicon nitride (SiN), silicon oxynitride (SiON), and aluminium nitride (AlN).

Figure 12:
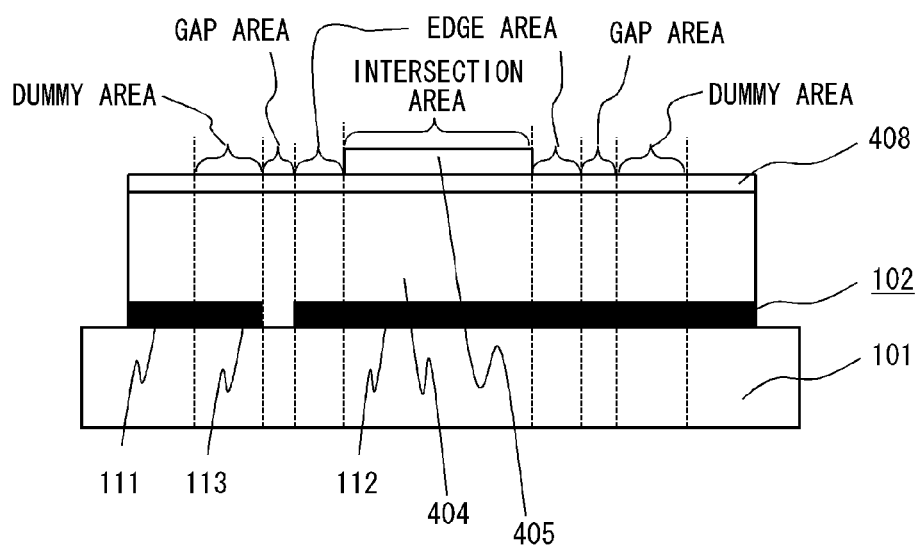
FIG. 12 shows another modification of the acoustic wave device according to the second embodiment of the present invention.

Furthermore, as shown in FIG. 12, the passivation film 408 may be provided between the first dielectric film 404 and the second dielectric film 405.

Figure 13:
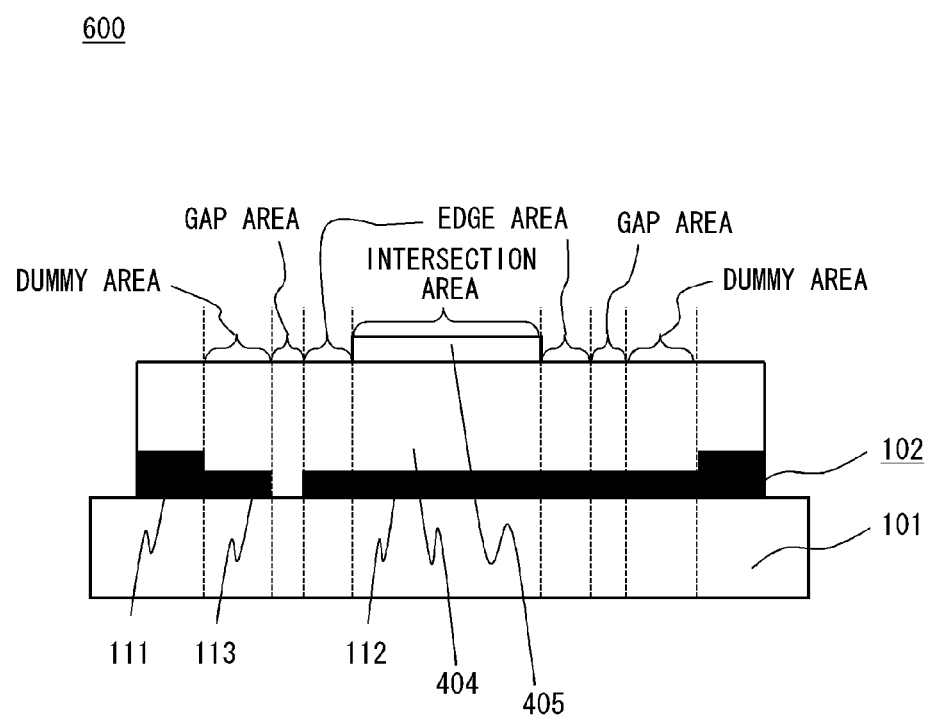
FIG. 13 shows another modification of the acoustic wave device according to the second embodiment of the present invention.

Further, as shown in FIG. 13, at least a part of the electrode film thickness of the bus bar 111 is made thicker than the electrode film thickness of the electrode fingers 112, thereby suppressing electrode resistance of the IDT electrodes 102 and improving characteristics of the acoustic wave device 400. It should be noted that, instead of the bus bar 111, the film thickness of a wiring electrode (not shown) connected to a bus bar may be made thicker than the electrode fingers 112 of the IDT electrodes 102. In this case, wiring resistance of the acoustic wave device 400 can be suppressed and insertion loss of the acoustic wave device 400 can be reduced.

Figure 14:
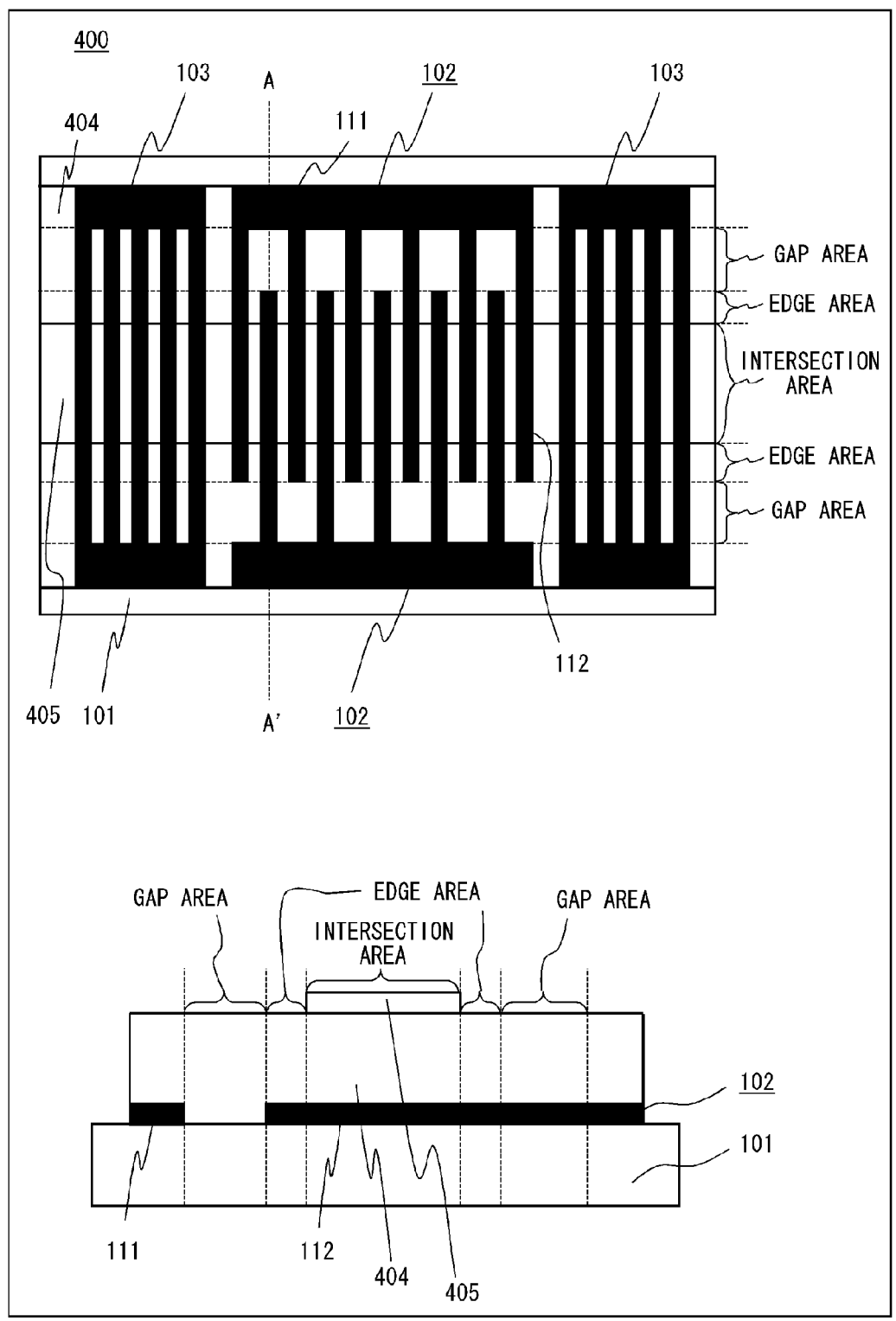
FIG. 14 shows another modification of the acoustic wave device according to the second embodiment of the present invention.

The acoustic wave device 400 in which the IDT electrodes 102 includes the dummy electrode fingers 113 has been described above; however, as shown in FIG. 14, the IDT electrodes 102 may not include the dummy electrode fingers 113. In this case, the IDT electrodes 102 have no dummy area and each gap area is an area between the ends the respective electrode fingers 112 and the bus bar of the other IDT electrode. In this case also, in the acoustic wave device 400, (acoustic velocity in the intersection area)>(acoustic velocity in the edge areas), and (acoustic velocity in the gap areas)>(acoustic velocity in the edge areas) are established. Consequently, a fundamental transverse mode wave can be confined in the intersection area and a high-order transverse mode wave which is spurious can be suppressed.

Third Embodiment

Figure 15:
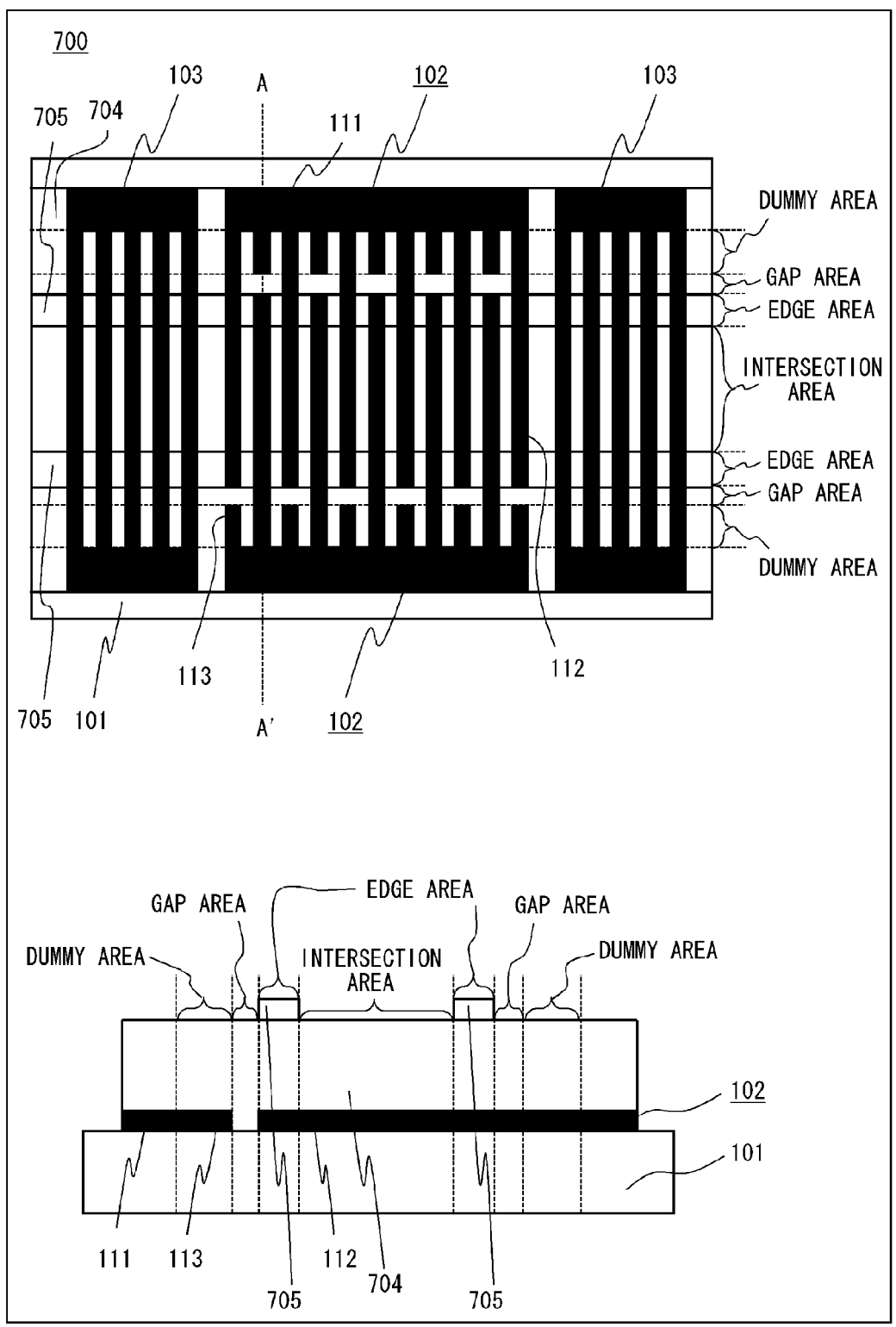
FIG. 15 is a top view and a sectional view of an acoustic wave device according to a third embodiment of the present invention.

Hereinafter, a third embodiment of the present invention will be described. FIG. 15 is a see-through top view of an acoustic wave device 700 according to the present embodiment and a sectional view of the same taken along a line A-A'. The acoustic wave device 700 includes, as in the same manner as the acoustic wave device 100 of the first embodiment, the piezoelectric substrate 101 and two IDT electrodes 102 and two reflectors 103 arranged on the piezoelectric substrate 101. However, the acoustic wave device 700 is different from the acoustic wave device 100 in that these components are covered with a first dielectric film 704 and further covered with a third dielectric film 705.

The acoustic wave device 700 is different from the acoustic wave device 400 of the second embodiment in that the third dielectric film 705 covers the edge areas on the first dielectric film 704 with a constant film thickness. An example of material of the first dielectric film 704 is silicon dioxide ($SiO_2$). Example of material of the third dielectric film 705 is tantalum(V) oxide ($Ta_2O_5$). These material are selected so that the third dielectric film 705 has an acoustic velocity is less than an acoustic velocity of first dielectric film 704.

In the acoustic wave device 700, (acoustic velocity in the intersection area)>(acoustic velocity in the edge areas) is established due to an influence of the third dielectric film that covers the edge areas. Further, in the acoustic wave device 700, (acoustic velocity in the gap areas)>(acoustic velocity in the edge areas) is established. Consequently, in the same manner as the first and second acoustic wave device 100 and 400, a high-order transverse mode wave which is spurious can be suppressed.

Still further, in the acoustic wave device 700, by covering a part of the bus bar area with the dielectric film, a passivation effect on the bus bar area can be obtained. At this time, the relationship among the acoustic velocities is represented by (acoustic velocity in the intersection area)>(acoustic velocity in the bus bar area), and (acoustic velocity in the edge areas) >(acoustic velocity in the bus bar area).

Figure 16:
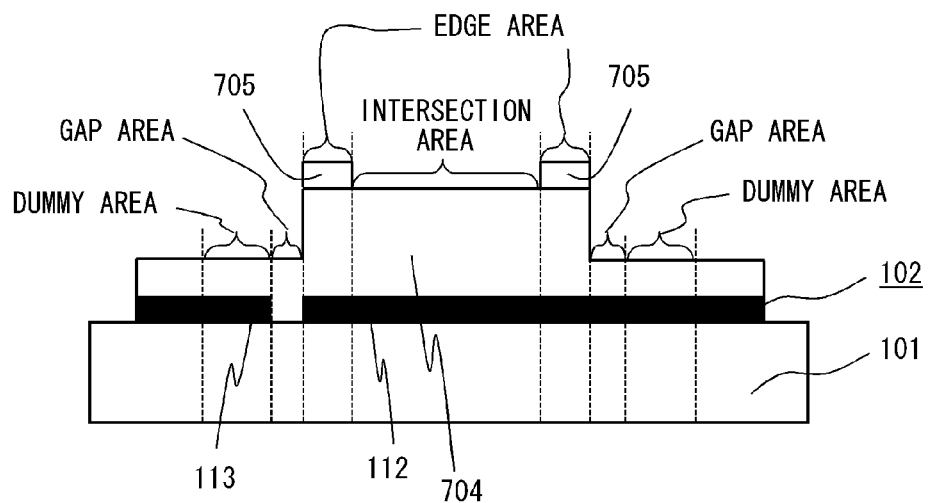
FIG. 16 shows a modification of the acoustic wave device according to the third embodiment of the present invention.

FIG. 16 shows a modification of the present embodiment. FIG. 16 shows a section of an acoustic wave device 800 according to the present embodiment, in the same manner as the sectional view of the acoustic wave device 100 shown in FIG. 1. The acoustic wave device 800 is different from the acoustic wave device 700 in that the film thickness of the first dielectric film 704 in the gap area, or in and outside the dummy area is thinner than the film thickness of the first dielectric film 704 in the edge area. Accordingly, an acoustic wave can be suppressed from leaking from the intersection area which is a main propagation path, thereby further enhancing confinement of the acoustic wave in the intersection area.

In the above embodiments, rotated Y cut lithium niobate is used as the piezoelectric substrate 101 and silicon dioxide is as dielectric films; however, the scope of the present invention can be also appropriately applied to materials different from piezoelectric substrate and dielectric film. Further, the present invention can be also applied to a case where the IDT electrodes 902 does not include dummy electrode fingers in the same manner as the acoustic wave device 900 shown in FIG. 9.

Figure 17:
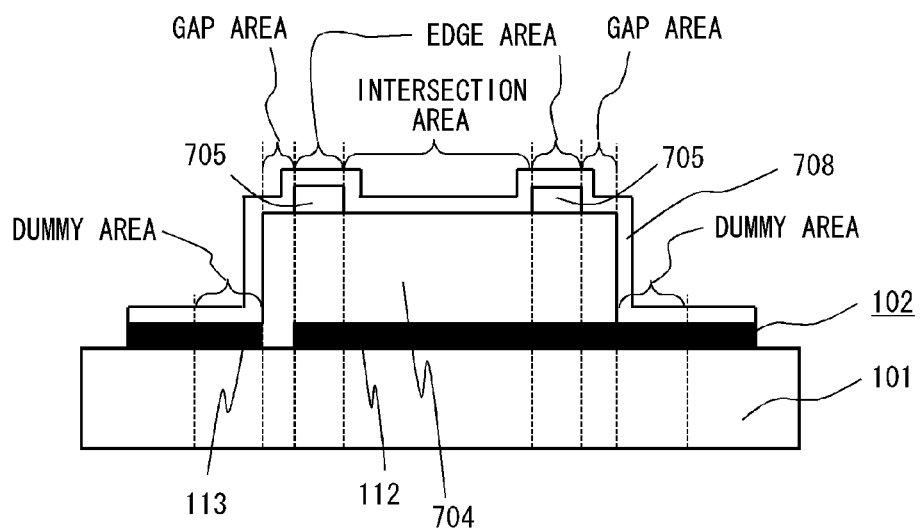
FIG. 17 shows another modification of the acoustic wave device according to the third embodiment of the present invention.

Further, as shown in FIG. 17, by covering the first dielectric film 704 by a passivation film 708 having a higher moisture resistance than the first dielectric film 704, moisture resistance of the acoustic wave device 700 can be improved. Examples of this passivation film are silicon nitride (SiN), silicon oxynitride (SiON), and aluminium nitride (AlN).

Figure 18:
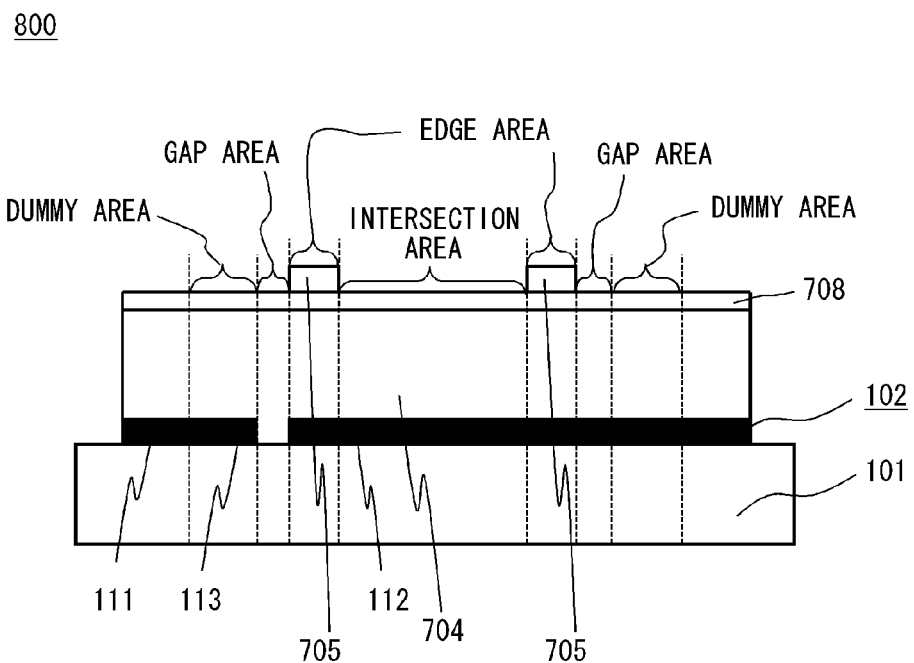
FIG. 18 shows another modification of the acoustic wave device according to the third embodiment of the present invention.

Furthermore, as shown in FIG. 18, the passivation film 708 may be provided between the first dielectric film 704 and the second dielectric film 705.

Figure 19:
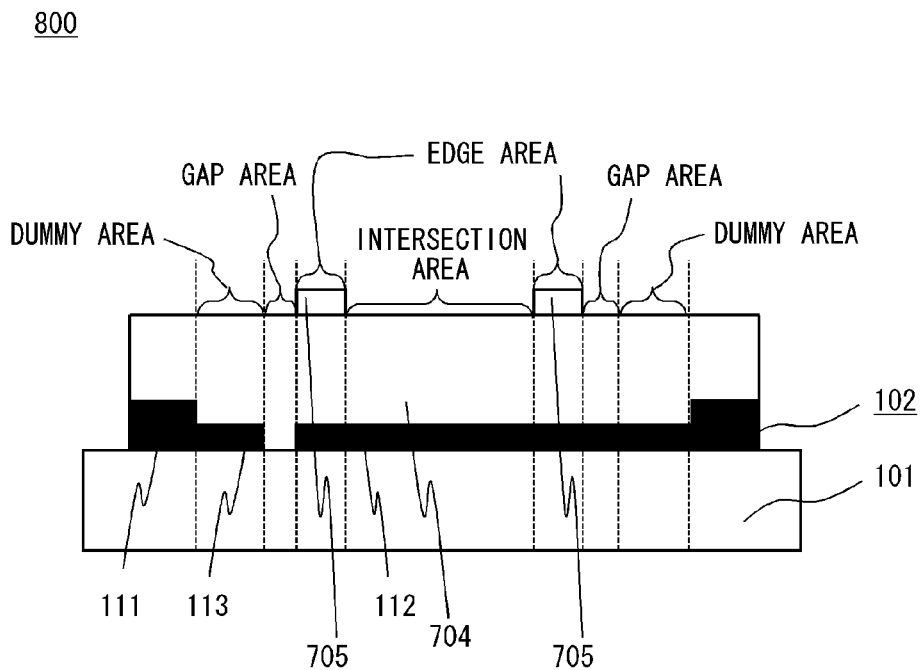
FIG. 19 shows another modification of the acoustic wave device according to the third embodiment of the present invention.

Further, as shown in FIG. 19, at least a part of the electrode film thickness of the bus bar 111 is made thicker than the electrode film thickness of the electrode fingers 112, thereby suppressing electrode resistance of the IDT electrodes 102 and improving characteristics of the acoustic wave device 700. It should be noted that, instead of the bus bar 111, the film thickness of a wiring electrode (not shown) connected to a bus bar may be made thicker than the electrode fingers 112 of the IDT electrodes 102. In this case, wiring resistance of the acoustic wave device 700 can be suppressed and insertion loss of the acoustic wave device 700 can be reduced.

Figure 20:
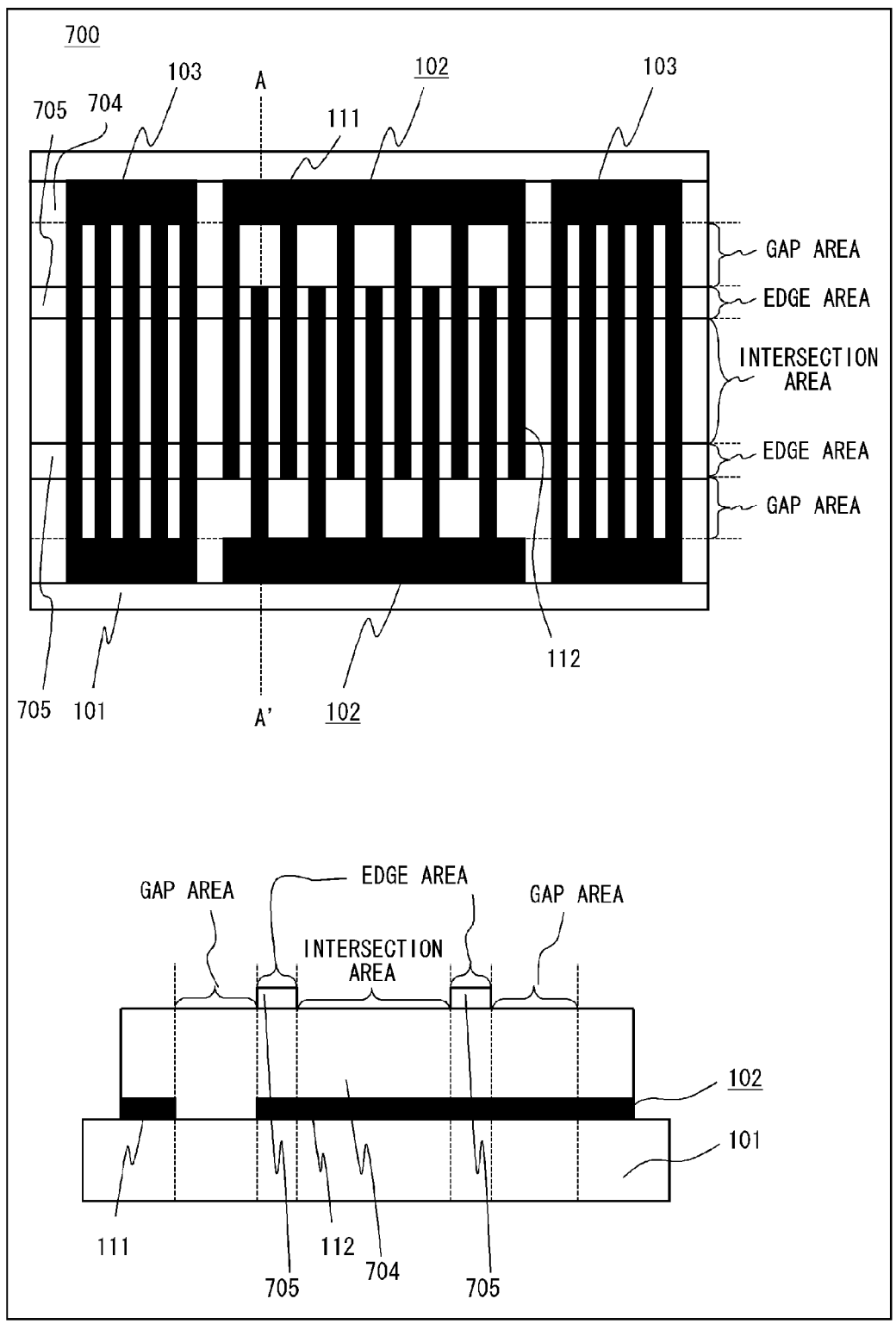
FIG. 20 shows another modification of the acoustic wave device according to the third embodiment of the present invention.

The acoustic wave device 700 in which the IDT electrodes 102 includes the dummy electrode fingers 113 has been described above; however, as shown in FIG. 20, the IDT electrodes 102 may not include the dummy electrode fingers 113. In this case, the IDT electrodes 102 have no dummy area and each gap area is an area between the ends of the respective electrode fingers 112 and the bus bar of the other IDT electrode. In this case also, in the acoustic wave device 700, (acoustic velocity in the intersection area)>(acoustic velocity in the edge areas), and (acoustic velocity in the gap areas)>(acoustic velocity in the edge areas) are established. Consequently, a fundamental transverse mode wave can be confined in the intersection area and a high-order transverse mode wave which is spurious can be suppressed.

Fourth Embodiment

Figure 21:
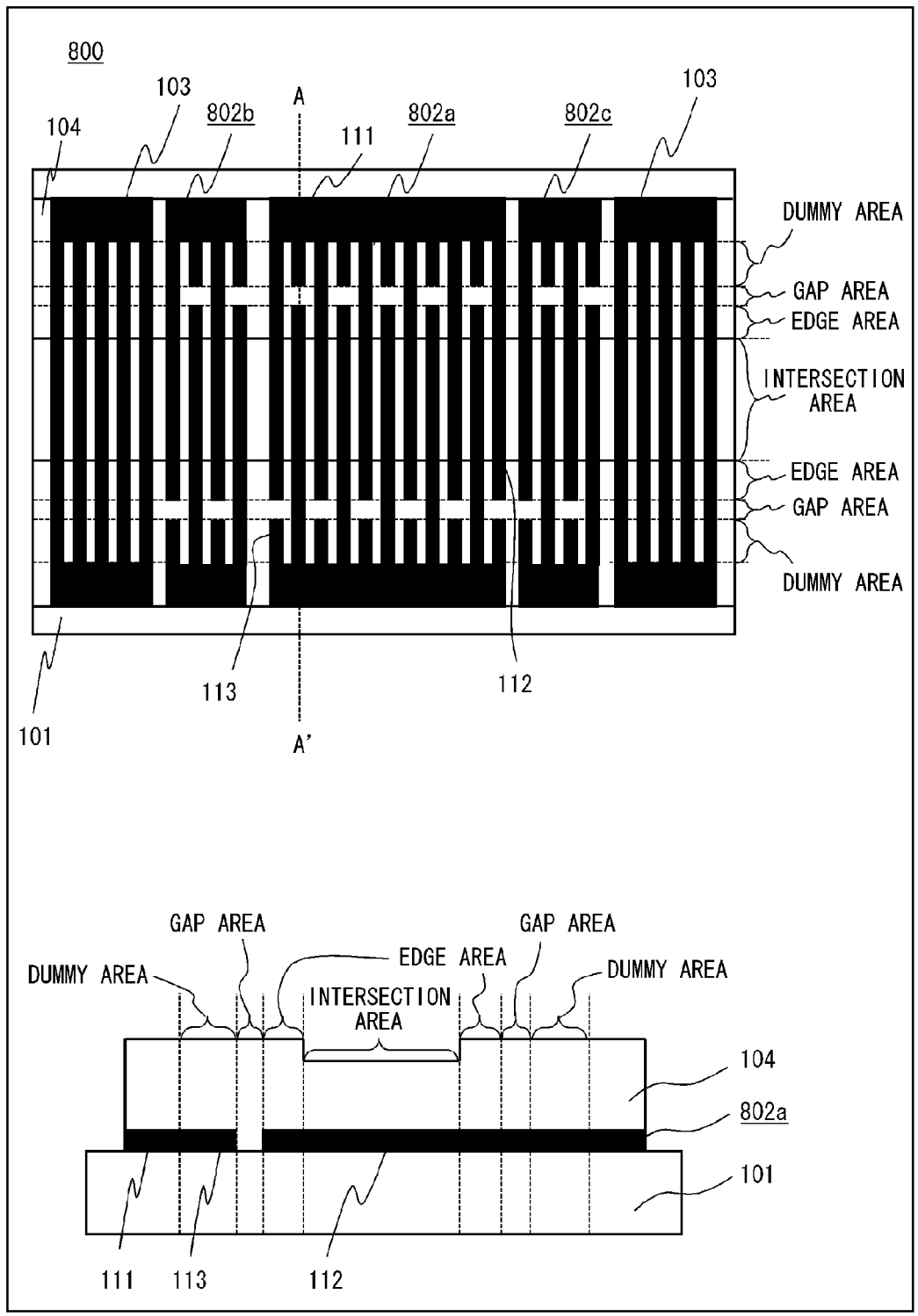
FIG. 21 is a top view and a sectional view of an acoustic wave device according to a fourth embodiment of the present invention.

Hereinafter, a fourth embodiment of the present invention will be described. FIG. 21 is a see-through top view of an acoustic wave device 800 according to the present embodiment and a sectional view of the same taken along a line A-A'. The acoustic wave device 800 is different from the acoustic wave device 100 in that, on the piezoelectric substrate 101, a plurality of pairs of IDT electrodes 802a, 802b, 802c are provided between two reflectors 803 in the propagating direction of a main acoustic wave, thereby constituting a longitudinally coupled filter. It should be noted that, FIG. 21, the acoustic wave device 800 shown in FIG. 21 includes three pairs of IDT electrodes; however, the acoustic wave device 800 may include two, four, or more pairs of IDT electrodes.

Also in the acoustic wave device 800, (acoustic velocity in the intersection area)>(acoustic velocity in the edge areas) is established. Further, in the acoustic wave device 800, (acoustic velocity in the gap areas)>(acoustic velocity in the edge areas) is established. Consequently, a high-order transverse mode wave which is spurious can be suppressed in the in the same manner as in the acoustic wave device 100.

Still further, in the acoustic wave device 00, by covering a part of the bus bar area with the dielectric film, a passivation effect on the bus bar area can be obtained. At this time, the relationship among the acoustic velocities is represented by (acoustic velocity in the intersection area)>(acoustic velocity in the bus bar area), and (acoustic velocity in the edge areas)>(acoustic velocity in the bus bar area).

(Modification 1)

Figure 22:
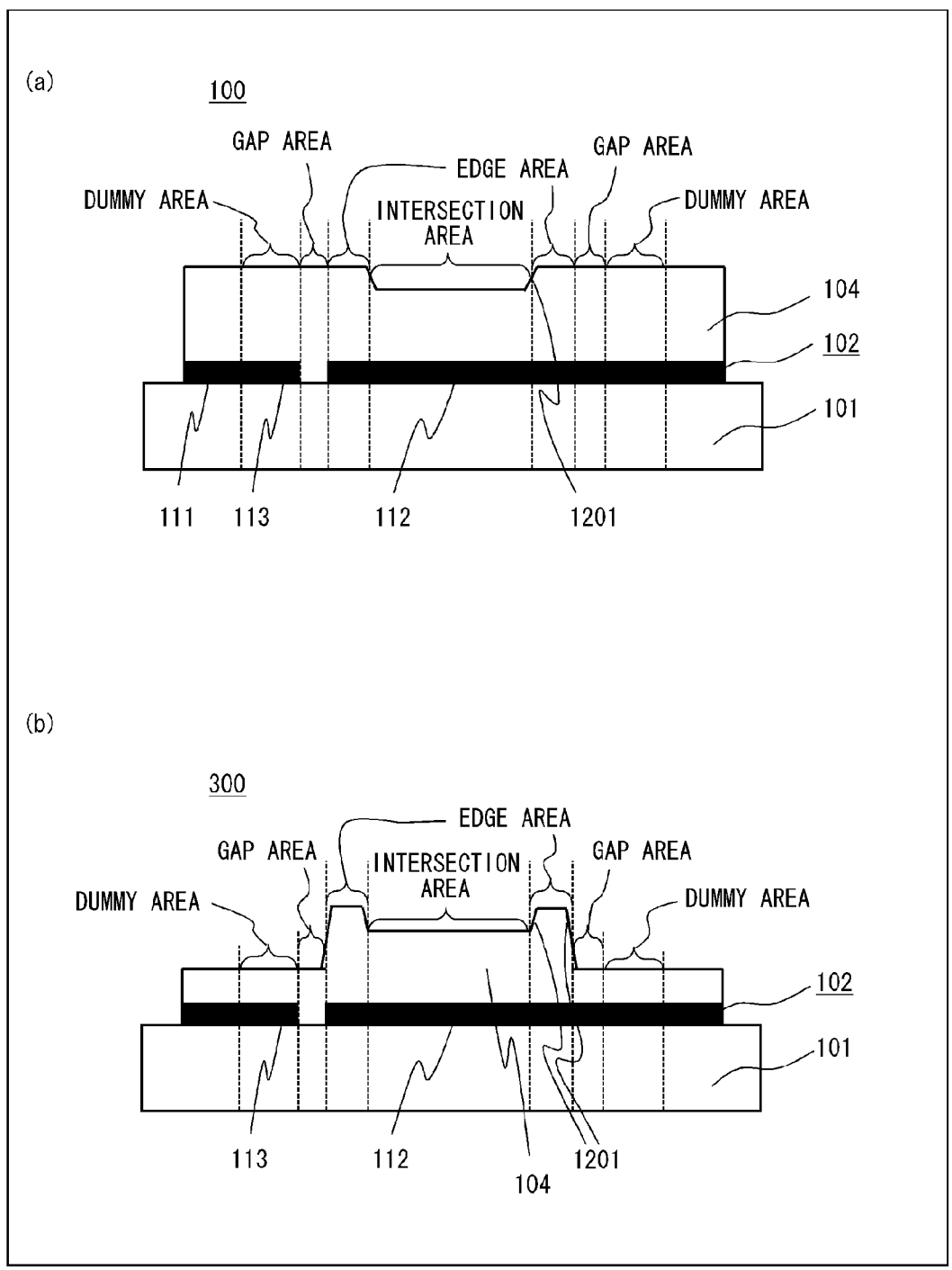
FIG. 22 shows a modification of the acoustic wave device according to the embodiments of the present invention.
Figure 23:
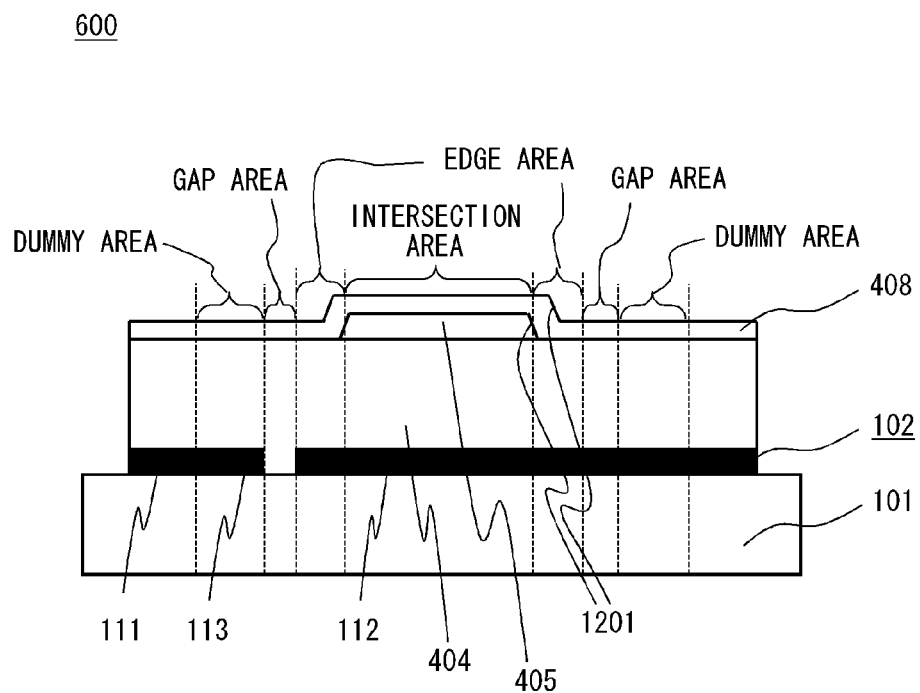
FIG. 23 shows another modification of the acoustic wave device according to the embodiments of the present invention.

In each of the above embodiments, it is preferable that tapered portions 1201 are provided at an end of each of the intersection area which is the main propagation path of an acoustic wave and the edge areas, at each end the film thickness of the dielectric film changes. Consequently, change of the film thickness becomes less sudden with the film thickness continuously changing. As an example, in (a) of FIG. 22, a sectional view of the acoustic wave device 100 according to the first embodiment shown in FIG. 1, in which the tapered portions 1201 are provided, on the dielectric film 104, at boundaries between the intersection area and each of the edge areas, is shown. As another example, in (b) of FIG. 22, a sectional view of the acoustic wave device 300 according to the first embodiment shown in FIG. 3, in which the tapered portions 1201 are provided, on the dielectric film 104, at boundaries between the intersection area and each of the edge areas and boundaries between the edge areas and the gap areas, is shown. As still another example, FIG. 23 shows a sectional view of the acoustic wave device 600 according to the second embodiment shown in FIG. 11, in which the tapered portions 1201 are provided, on the second dielectric film 405 and the passivation film 408, at boundaries between the intersection area and each of the edge areas. As in these examples, when the film thickness of the dielectric films is continuously changed by the tapered portions 1201, sudden change of the acoustic velocity of an acoustic wave which propagates through the boundaries can be suppressed when compared to when the film thickness is changed suddenly, thereby reducing undesired spurious waves.

(Modification 2)

Figure 24:
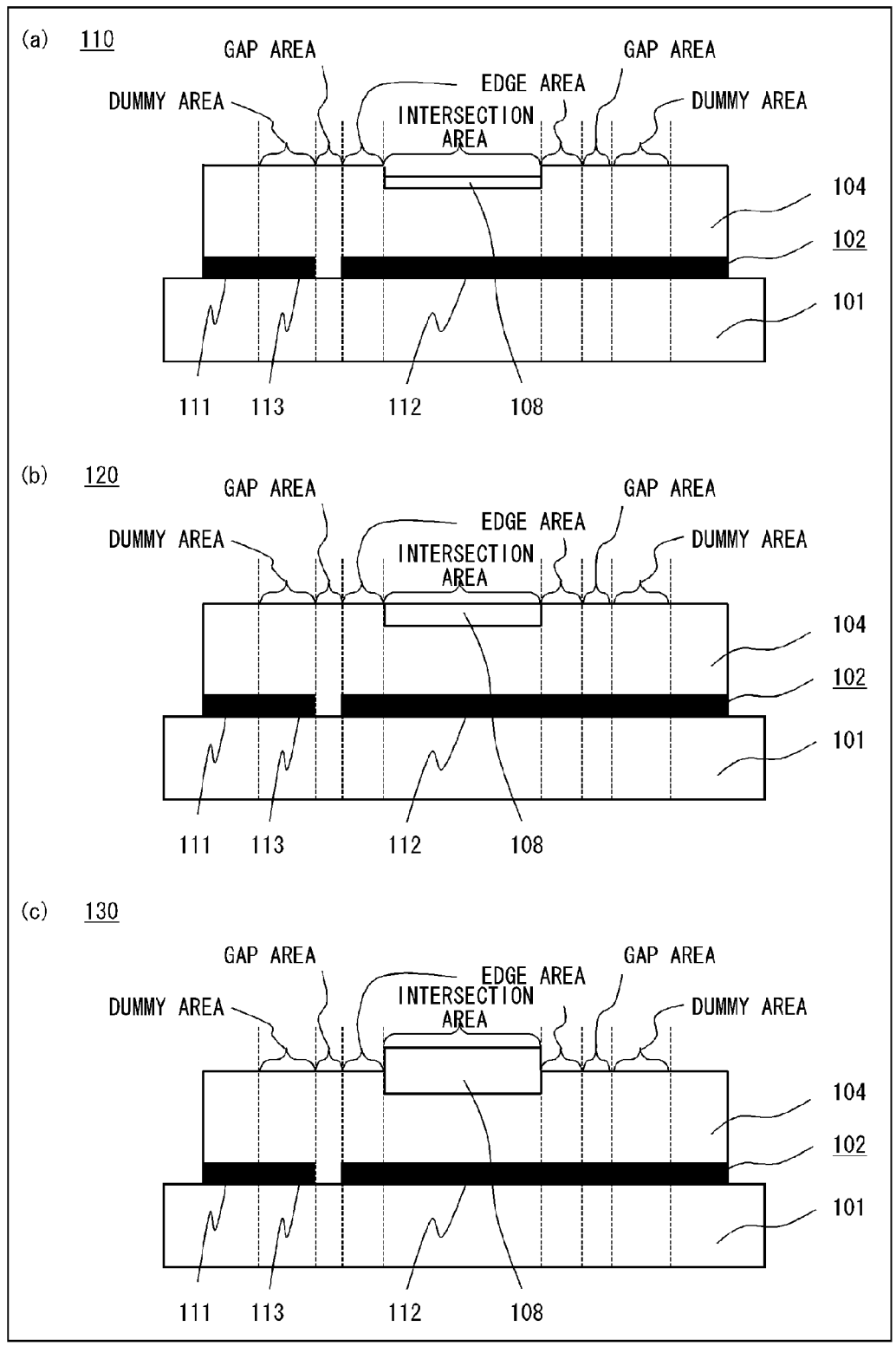
FIG. 24 shows another modification of the acoustic wave device according to the embodiments of the present invention.

In each of the above embodiments, when providing a passivation film, the passivation film may be provided only in the intersection area. FIG. 24 is sectional views of acoustic wave devices 110, 120, and 130 which are different from the acoustic wave device 100 according to the first embodiment in that the passivation film 108 covers only the intersection area of the dielectric film 104. In the acoustic wave device 110 shown in (a) of FIG. 24, the passivation film 108 has a thickness which is thinner than a difference between the film thickness in the intersection area and the film thickness in the edge area of the dielectric film 104. In the acoustic wave device 120 shown in (b) of FIG. 24, the passivation film 108 has a thickness which is equal to a difference between the film thickness in the intersection area and the film thickness in the edge area of the dielectric film 104. In the acoustic wave device 130 shown in (c) of FIG. 24, the passivation film 108 has a thickness which is thicker than a difference between the film thickness in the intersection area and the film thickness in the edge area of the dielectric film 104.

Figure 25:
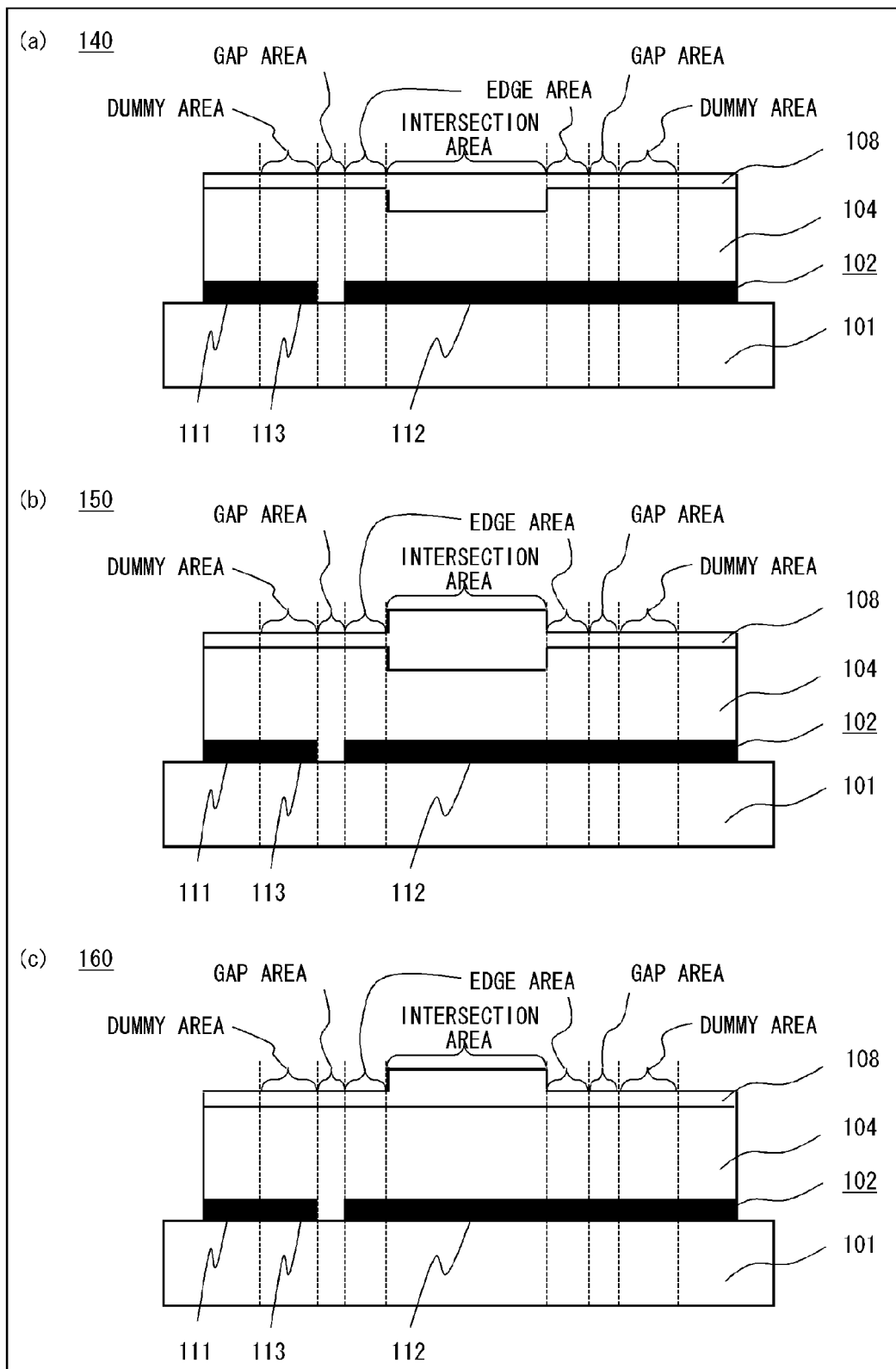
FIG. 25 shows another modification of the acoustic wave device according to the embodiments of the present invention.
Figure 26:
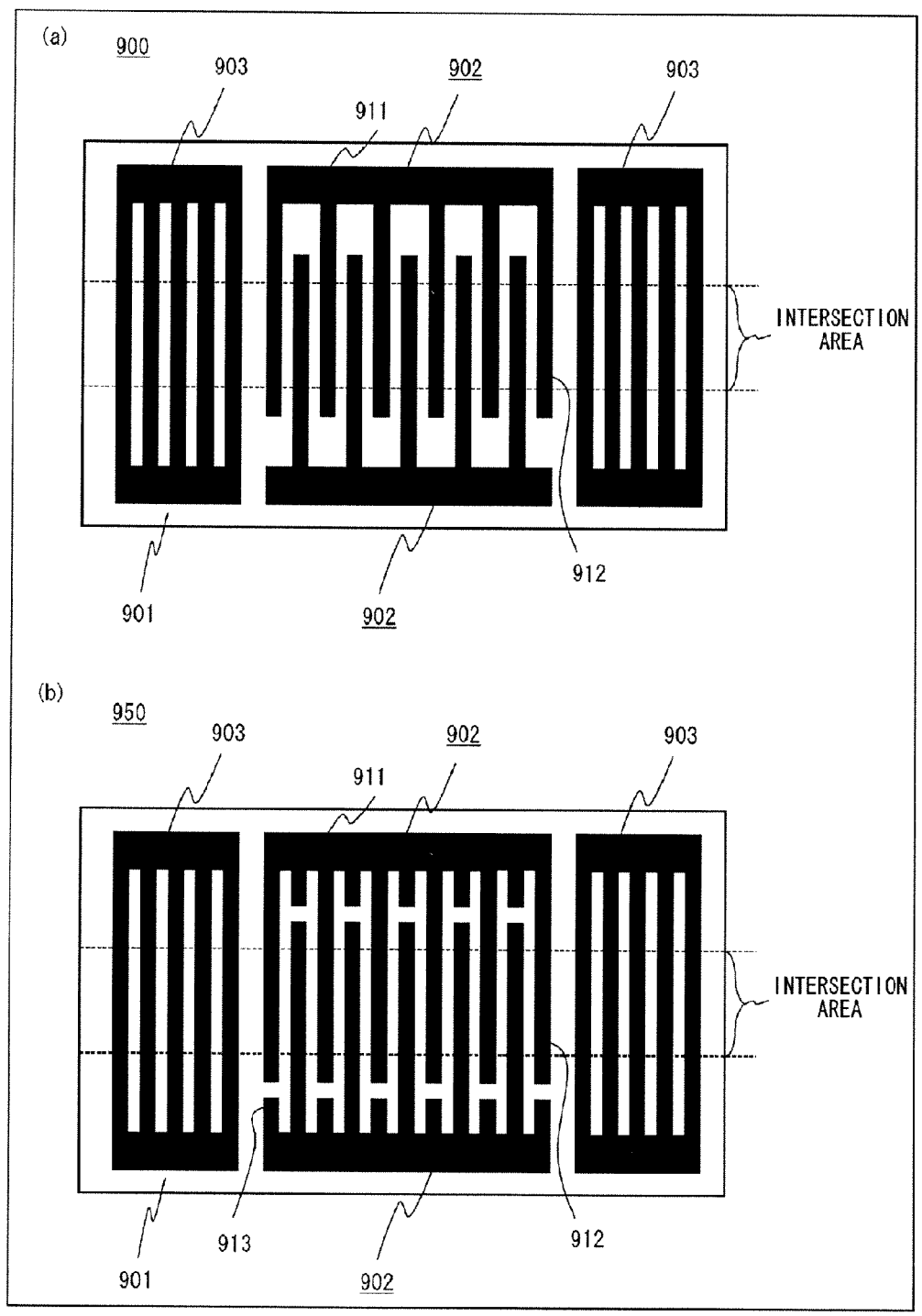
FIG. 26 is a top view of a conventional acoustic wave device.
Figure 27:
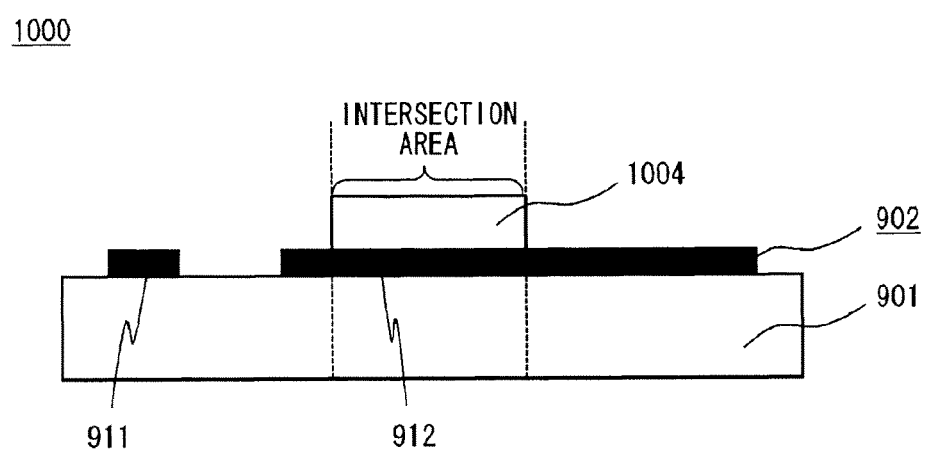
FIG. 27 is a sectional view of a conventional acoustic wave device.

Further, in each of the above embodiments, a passivation film may be provided in the intersection area and the other areas, and the film thickness of the passivation film in the intersection area may be thicker than the film thickness in the other areas. (a) of FIG. 25 and (b) of FIG. 25 are sectional views of acoustic wave devices 140, 150 which are different from the acoustic wave device 100 according to the first embodiment in that the passivation film 108 covers the entirety of the dielectric film 104, and has a thicker film thickness in the intersection area than in the other areas. In the acoustic wave device 140, the passivation film 108 has a flat surface. In the acoustic wave device 150, the passivation film 108 has a surface which protrudes at a portion thereof covering the intersection area.

As in the acoustic wave devices 110 to 150, the passivation film 108 having a greater acoustic velocity than that of the dielectric film 104 covers only the intersection area or a region including the intersection area such that the film thickness is thicker in the intersection area than in the region other than the intersection area, thereby increasing a difference between the acoustic velocity in the intersection area and the acoustic velocity in the other areas. Consequently, an effect of confining a fundamental transverse mode wave in the intersection area can be enhanced. Furthermore, even when the dielectric film 104 and the electrode fingers 112 have different thicknesses, by providing the passivation film 108 with an appropriate thickness, an acoustic velocity can be easily adjusted finely and a predetermined frequency characteristic can be obtained. The present modification is also applicable to the acoustic wave devices according to the embodiments other than the acoustic wave device 100.

Further, (c) of FIG. 25 is a sectional view of an acoustic wave device 160 which is different from the acoustic wave device 100 according to the first embodiment in that the dielectric film 104 has an even thickness and that the passivation film 108 covers the entirety of the dielectric film 104 and has a thicker film thickness in the intersection area than in the other areas. If the acoustic velocity in the intersection area can be greater and a difference between the acoustic velocity in the intersection area and the acoustic velocity in the edge area can be sufficiently large owing to the difference of the film thickness of the passivation film 108, the dielectric film 104 may have an even film thickness in this manner.

Further, in each of the above modifications, the passivation film 108 may have a tapered shape such that the film thickness thereof continuously changes at the end of the intersection area. Accordingly, undesired spurious waves can be reduced.

INDUSTRIAL APPLICABILITY

The present invention is useful for application to a surface acoustic wave device used for an information communication device, and the like.

REFERENCE SIGNS LIST

100, 110, 120, 130, 140, 150, 160, 300, 400, 600, 700, 800, 900, 1000, 1100, 1150 acoustic wave device
101, 901 piezoelectric substrate
102, 902 IDT electrode
103, 903 reflector
104, 104a, 104b, 404, 405, 704, 705, 1154, 1204 dielectric film
108, 408, 708 passivation film
111, 911 bus bar
112, 912 electrode finger
113, 913 dummy electrode finger
1004 coating film
1201 tapered portion

The invention claimed is:

1. An acoustic wave device comprising:
a piezoelectric substrate;
a pair of IDT electrodes formed on the piezoelectric substrate, a first IDT electrode of the pair of IDT electrodes including a first bus bar and a first plurality of electrode fingers extending from the first bus bar, a second IDT electrode of the pair of IDT electrodes including a second bus bar and a second plurality of electrode fingers extending from the second bus bar, the first plurality of electrode fingers interleaved with the second plurality of electrode fingers; and
a first dielectric film covering at least a part of the piezoelectric substrate and the pair of IDT electrodes, the first dielectric film covering an intersection area in which the first plurality and second plurality of electrode fingers are arranged interleaved with each other and edge areas adjacent to the intersection area, an acoustic velocity of an acoustic wave in the intersection area being greater than the acoustic velocity of the acoustic wave in the edge areas, the first dielectric film including a first area covering the intersection area and/or one of the edge areas and having a first thickness, a second area adjacent the intersection area and/or the one of the edge areas and having a second thickness, and a tapered area formed at an intersection of the first area and the second area, a thickness of the first dielectric film continuously changing in the tapered area.

2. The acoustic wave device of claim 1 wherein each of the pair of IDT electrodes includes a plurality of dummy electrode fingers.

3. The acoustic wave device of claim 1 wherein the acoustic velocity of the acoustic wave in each of a pair of gap areas defined in the acoustic wave device is greater than the acoustic velocity of the acoustic wave in each edge area of the acoustic wave device.

4. The acoustic wave device of claim 2 wherein the acoustic velocity of the acoustic wave in each of a pair of gap areas defined in the acoustic wave device is greater than the acoustic velocity of the acoustic wave in each edge area of the acoustic wave device.

5. The acoustic wave device of claim 1 wherein a film thickness of the first dielectric film in the intersection area is thinner than a film thickness of the first dielectric film in the edge areas.

6. The acoustic wave device of claim 1 wherein the first dielectric film has one of a lamination structure including two kinds of silicon dioxide films and a lamination structure including a silicon dioxide film and a dielectric film that further covers the silicon dioxide film.

7. The acoustic wave device of claim 1 further comprising a second dielectric film formed on the first dielectric film and further covering the intersection area, the acoustic velocity of the acoustic wave in the second dielectric film being greater than the acoustic velocity of the acoustic wave in the first dielectric film.

8. The acoustic wave device of claim 7 wherein the first dielectric film includes silicon dioxide and the second dielectric film includes one of silicon nitride, silicon oxynitride, and aluminium nitride.

9. The acoustic wave device of claim 1 further comprising a second dielectric film formed on the first dielectric film and further covering the edge areas, the acoustic velocity of the acoustic wave in the second dielectric film being less than the acoustic velocity of the acoustic wave in the first dielectric film.

10. The acoustic wave device of claim 9 wherein the first dielectric film includes silicon dioxide and of the third dielectric film includes tantalum(V) oxide.

11. The acoustic wave device of claim 1 wherein a portion of the first dielectric film covering the intersection area is covered with a passivation film having a moisture resistance higher than a moisture resistance of the first dielectric film.

12. The acoustic wave device of claim 1 wherein the dielectric film is covered with a passivation film having a moisture resistance higher than a moisture resistance of the dielectric film, a film thickness of the passivation film covering the intersection area being thicker than a film thickness of the passivation film in areas other than the intersection area.

13. The acoustic wave device of claim 1 wherein at least a part of an electrode film thickness of the first bus bar is thicker than an electrode film thickness of the first plurality of electrode fingers.

14. The acoustic wave device of claim 2 wherein the first dielectric film covers the plurality of dummy electrode fingers.

15. The acoustic wave device of claim 1 wherein the piezoelectric substrate has a cut angle of between 36 degrees and 41 degrees.

16. The acoustic wave device of claim 1 wherein the IDT electrode has a lamination structure including a first metal layer including one of platinum, tungsten, and molybdenum and a second metal layer laminated on the first metal layer and having a higher conductivity than the first metal layer.

17. The acoustic wave device of claim 1 further comprising two reflectors formed on the piezoelectric substrate, a plurality of pairs of the IDT electrodes formed between the two reflectors, the two reflectors and the plurality of pairs of the IDT electrodes arranged along a propagating direction of a main acoustic wave and forming a longitudinally coupled filter.

18. An acoustic wave device comprising:
   a piezoelectric substrate;
   a pair of IDT electrodes formed on the piezoelectric substrate, a first IDT electrode of the pair of IDT electrodes including a first plurality of electrode fingers, a second IDT electrode of the pair of IDT electrodes including a second plurality of electrode fingers, the first plurality of electrode fingers interleaved with the second plurality of electrode fingers; and
   a dielectric film covering at least a part of the piezoelectric substrate and the pair of IDT electrodes, the dielectric film covering an intersection area in which the first plurality of electrode fingers and the second plurality of electrode fingers are interleaved with each other and edge areas adjacent to the intersection area, an acoustic velocity of an acoustic wave in the intersection area being greater than the acoustic velocity of the acoustic wave in the edge areas, the dielectric film including a first area covering the intersection area and/or one of the edge areas and having a first thickness, a second area adjacent the intersection area and/or the one of the edge areas and having a second thickness, and a tapered area formed at an intersection of the first area and the second area, a thickness of the dielectric film continuously changing in the tapered area.

19. The acoustic wave device of claim 18 further comprising a gap area adjacent one of the edge areas, the dielectric film covering the gap area, the acoustic velocity of the acoustic wave in the gap area being greater than the acoustic velocity of the acoustic wave in the one of the edge areas.

20. The acoustic wave device of claim 19 wherein the pair of IDT electrodes each includes a bus bar covered by the dielectric film and bus bar areas defined above the bus bars, the acoustic velocity of the acoustic wave in each of the bus bar areas being less than the acoustic velocity of the acoustic wave in the one of the edge areas.

* * * * *

UNITED STATES PATENT AND TRADEMARK OFFICE
CERTIFICATE OF CORRECTION

PATENT NO. : 9,065,424 B2
APPLICATION NO. : 13/992624
DATED : June 23, 2015
INVENTOR(S) : Hidekazu Nakanishi et al.

It is certified that error appears in the above-identified patent and that said Letters Patent is hereby corrected as shown below:

In the Claims:

Column 14, Line 35, Claim 10, delete "of".

Signed and Sealed this
Fifth Day of January, 2016

Michelle K. Lee
*Director of the United States Patent and Trademark Office*